(12) United States Patent
Wang et al.

(10) Patent No.: US 11,588,031 B2
(45) Date of Patent: Feb. 21, 2023

(54) SEMICONDUCTOR STRUCTURE FOR MEMORY DEVICE AND METHOD FOR FORMING THE SAME

(71) Applicant: TAIWAN SEMICONDUCTOR MANUFACTURING COMPANY LTD., Hsinchu (TW)

(72) Inventors: Szu-Yu Wang, Hsinchu (TW); Chia-Wei Hu, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 154 days.

(21) Appl. No.: 16/730,537

(22) Filed: Dec. 30, 2019

(65) Prior Publication Data

US 2021/0202706 A1 Jul. 1, 2021

(51) Int. Cl.
*H01L 29/423* (2006.01)
*H01L 29/788* (2006.01)
*H01L 29/49* (2006.01)
*H01L 29/66* (2006.01)
*H01L 21/28* (2006.01)
(Continued)

(52) U.S. Cl.
CPC .. *H01L 29/42328* (2013.01); *H01L 21/32133* (2013.01); *H01L 21/32139* (2013.01); *H01L 29/40114* (2019.08); *H01L 29/4916* (2013.01); *H01L 29/66825* (2013.01);
(Continued)

(58) Field of Classification Search
CPC .. H01L 27/115–11597; H01L 27/11517–1156; H01L 27/11526–11548; H01L 27/11551–11556; H01L 29/42324–42336; H01L 21/28105; H01L 29/4983; H01L 2924/1451;
(Continued)

(56) References Cited

U.S. PATENT DOCUMENTS 6,093,956 A * 7/2000 Moore .............. H01L 21/76202
257/E21.258
7,829,917 B1 * 11/2010 Thomas .............. H01L 29/0692
257/197
(Continued)

FOREIGN PATENT DOCUMENTS

TW 201601258 A 1/2016
TW 201737470 A 10/2017

OTHER PUBLICATIONS

Office Action, Cited Reference and Search Report dated Aug. 5, 2021 issued by the Taiwan Intellectual Property office for the Taiwanese Counterpart Application No. 109120654.
(Continued)

*Primary Examiner* — Maliheh Malek
(74) *Attorney, Agent, or Firm* — WPAT Law; Anthony King

(57) ABSTRACT

A semiconductor structure for a memory device includes a first gate structure and a second gate structure adjacent to the first gate structure. The second gate structure includes a first layer and a second layer, and the first layer is between the second layer and the first gate structure. The first layer and the second layer include a same semiconductor material and same dopants. The first layer has a first dopant concentration, and the second layer has a second dopant concentration different from the firs dopant concentration.

20 Claims, 29 Drawing Sheets

(51) Int. Cl.
*H01L 21/3213* (2006.01)
*H01L 21/02* (2006.01)

(52) U.S. Cl.
CPC ........ *H01L 29/788* (2013.01); *H01L 21/0262* (2013.01); *H01L 21/02532* (2013.01); *H01L 29/66545* (2013.01)

(58) Field of Classification Search
CPC ........ H01L 29/788–7889; G11C 2216/06–10; G11C 16/00–349; G11C 16/0408–0458
See application file for complete search history.

(56) References Cited

U.S. PATENT DOCUMENTS

| | | | | |
|---|---|---|---|---|
| 7,928,496 | B2* | 4/2011 | Takeuchi | H01L 27/115 257/E29.132 |
| 7,936,005 | B2* | 5/2011 | Okamura | H01L 27/11568 257/E21.426 |
| 7,956,406 | B2* | 6/2011 | Yasuda | H01L 23/528 438/257 |
| 8,466,022 | B2* | 6/2013 | Tanaka | H01L 29/513 257/326 |
| 8,471,319 | B2* | 6/2013 | Matsuo | H01L 29/7883 257/E21.21 |
| 8,669,607 | B1* | 3/2014 | Tsair | H01L 29/7881 257/316 |
| 8,809,179 | B2* | 8/2014 | Wang | H01L 27/11568 438/597 |
| 8,994,089 | B2* | 3/2015 | Rogers | H01L 29/40114 257/315 |
| 9,082,837 | B2* | 7/2015 | Perera | H01L 29/78 |
| 9,391,084 | B2* | 7/2016 | Lue | H01L 27/11582 |
| 9,406,693 | B1* | 8/2016 | Pang | H01L 29/04 |
| 9,659,953 | B2* | 5/2017 | Chuang | H01L 29/6656 |
| 9,711,620 | B2* | 7/2017 | Tsai | H01L 29/66553 |
| 9,812,460 | B1* | 11/2017 | Wu | H01L 27/11546 |
| 10,134,748 | B2* | 11/2018 | Liu | H01L 27/11548 |
| 10,153,051 | B1* | 12/2018 | Chen | G11C 11/5628 |
| 10,156,335 | B1* | 12/2018 | Li | H01L 33/60 |
| 10,224,430 | B1* | 3/2019 | Hekmatshoartabari | C30B 23/025 |
| 10,734,394 | B2* | 8/2020 | Liu | H01L 27/11521 |
| 11,024,505 | B2* | 6/2021 | Wei | H01L 21/32134 |
| 11,088,159 | B2* | 8/2021 | Chen | H01L 29/42344 |
| 11,152,384 | B2* | 10/2021 | Chuang | H01L 21/32139 |
| 11,158,377 | B2* | 10/2021 | Yang | G11C 11/1657 |
| 11,276,530 | B2* | 3/2022 | Totsuka | H01L 29/94 |
| 2002/0153572 | A1* | 10/2002 | Kusunoki | H01L 21/743 257/E21.538 |
| 2005/0045941 | A1* | 3/2005 | Kurita | H01L 27/11524 257/315 |
| 2005/0127428 | A1* | 6/2005 | Mokhlesi | H01L 29/7883 257/315 |
| 2007/0096202 | A1* | 5/2007 | Kang | H01L 21/764 257/324 |
| 2007/0241388 | A1* | 10/2007 | Yamamoto | H01L 27/11521 257/314 |
| 2007/0262372 | A1* | 11/2007 | Yamamoto | H01L 29/42336 257/E27.103 |
| 2008/0290401 | A1* | 11/2008 | Yasui | H01L 29/792 257/324 |
| 2010/0059817 | A1* | 3/2010 | Pham | H01L 29/7833 438/303 |
| 2010/0093142 | A1* | 4/2010 | Ho | H01L 27/11521 257/E21.267 |
| 2010/0102377 | A1* | 4/2010 | Iikawa | H01L 27/11521 257/E21.546 |
| 2010/0248435 | A1* | 9/2010 | Olsen | H01L 27/11521 257/E21.422 |
| 2015/0054048 | A1* | 2/2015 | Loiko | H01L 29/42344 257/316 |
| 2015/0084111 | A1* | 3/2015 | Wu | H01L 27/11548 257/316 |
| 2015/0137206 | A1* | 5/2015 | Liu | H01L 27/11548 257/316 |
| 2015/0333082 | A1* | 11/2015 | Chuang | H01L 29/7831 257/326 |
| 2016/0013197 | A1* | 1/2016 | Liu | H01L 29/42344 257/322 |
| 2016/0013198 | A1* | 1/2016 | Liu | H01L 29/66833 257/322 |
| 2016/0020219 | A1* | 1/2016 | Chuang | H01L 29/0649 257/324 |
| 2016/0056250 | A1* | 2/2016 | Chuang | H01L 29/66833 257/326 |
| 2016/0099252 | A1* | 4/2016 | Tran | H01L 21/823487 257/314 |
| 2016/0181268 | A1* | 6/2016 | Chuang | H01L 21/823842 257/314 |
| 2016/0190268 | A1* | 6/2016 | Wu | H01L 29/66825 257/316 |
| 2016/0260728 | A1* | 9/2016 | Chen | H01L 29/66825 |
| 2016/0307909 | A1* | 10/2016 | Tseng | H01L 29/42344 |
| 2017/0047336 | A1* | 2/2017 | Zaka | H01L 27/11524 |
| 2017/0236833 | A1* | 8/2017 | Chuang | H01L 29/6656 257/324 |
| 2018/0012898 | A1* | 1/2018 | Wu | H01L 29/7883 |
| 2018/0102258 | A1* | 4/2018 | Chen | H01L 21/324 |
| 2018/0151579 | A1* | 5/2018 | Liu | H01L 27/11526 |
| 2018/0151707 | A1* | 5/2018 | Wu | H01L 29/0649 |
| 2018/0233513 | A1* | 8/2018 | Zhang | G11C 16/08 |
| 2018/0277664 | A1* | 9/2018 | Shen | H01L 21/046 |
| 2018/0342527 | A1* | 11/2018 | Yang | H01L 27/11543 |
| 2019/0067302 | A1* | 2/2019 | Wu | H01L 29/495 |
| 2019/0198515 | A1* | 6/2019 | Hosoda | H01L 21/26513 |
| 2019/0333581 | A1* | 10/2019 | Diep | H01L 27/11582 |
| 2019/0348435 | A1* | 11/2019 | Nagata | H01L 27/11575 |
| 2019/0393235 | A1* | 12/2019 | Teng | H01L 27/11524 |
| 2020/0058665 | A1* | 2/2020 | Lin | H01L 23/5329 |
| 2020/0105777 | A1* | 4/2020 | Lin | H01L 27/11548 |
| 2020/0381443 | A1* | 12/2020 | Shih | H01L 21/32137 |
| 2021/0082865 | A1* | 3/2021 | Baraskar | H01L 25/50 |
| 2021/0098586 | A1* | 4/2021 | Lin | H01L 21/02244 |
| 2021/0343735 | A1* | 11/2021 | Shih | H01L 27/11531 |
| 2021/0343738 | A1* | 11/2021 | Chen | H01L 28/91 |
| 2022/0102527 | A1* | 3/2022 | Hsieh | H01L 29/41791 |
| 2022/0149176 | A1* | 5/2022 | More | H01L 21/02603 |

OTHER PUBLICATIONS

English Abstract of TW201737470A.
U.S. Pat. No. 9,391,084B2 Corresponds to TW201601258A.

* cited by examiner

SEMICONDUCTOR STRUCTURE FOR MEMORY DEVICE AND METHOD FOR FORMING THE SAME

BACKGROUND

Non-volatile memory (NVM) is often used in various devices, such as computers. NVM is a type of memory storage that can retain data even while it is not supplied with power. NVM may be electrically addressed or mechanically addressed. Examples of electrically-addressed NVM include flash memory, EPROMs, and EEPROMs. Functionality of NVM includes having information programmed to it, having information read from it, and having information erased from it.

Common types of flash memory devices include stacked-gate flash memory devices and split-gate flash memory devices. Split-gate flash memory devices have several advantages over stacked-gate flash memory devices, such as lower power consumption, higher injection efficiency, lower susceptibility to short channel effect, and over-erase immunity. Examples of split-gate flash memory devices include silicon-oxide-nitride-oxide-silicon (SONOS) split-gate flash memory devices, metal-oxide-nitride-oxide-silicon (MONOS) split-gate flash memory devices, and third-generation SUPERFLASH (ESF3) memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
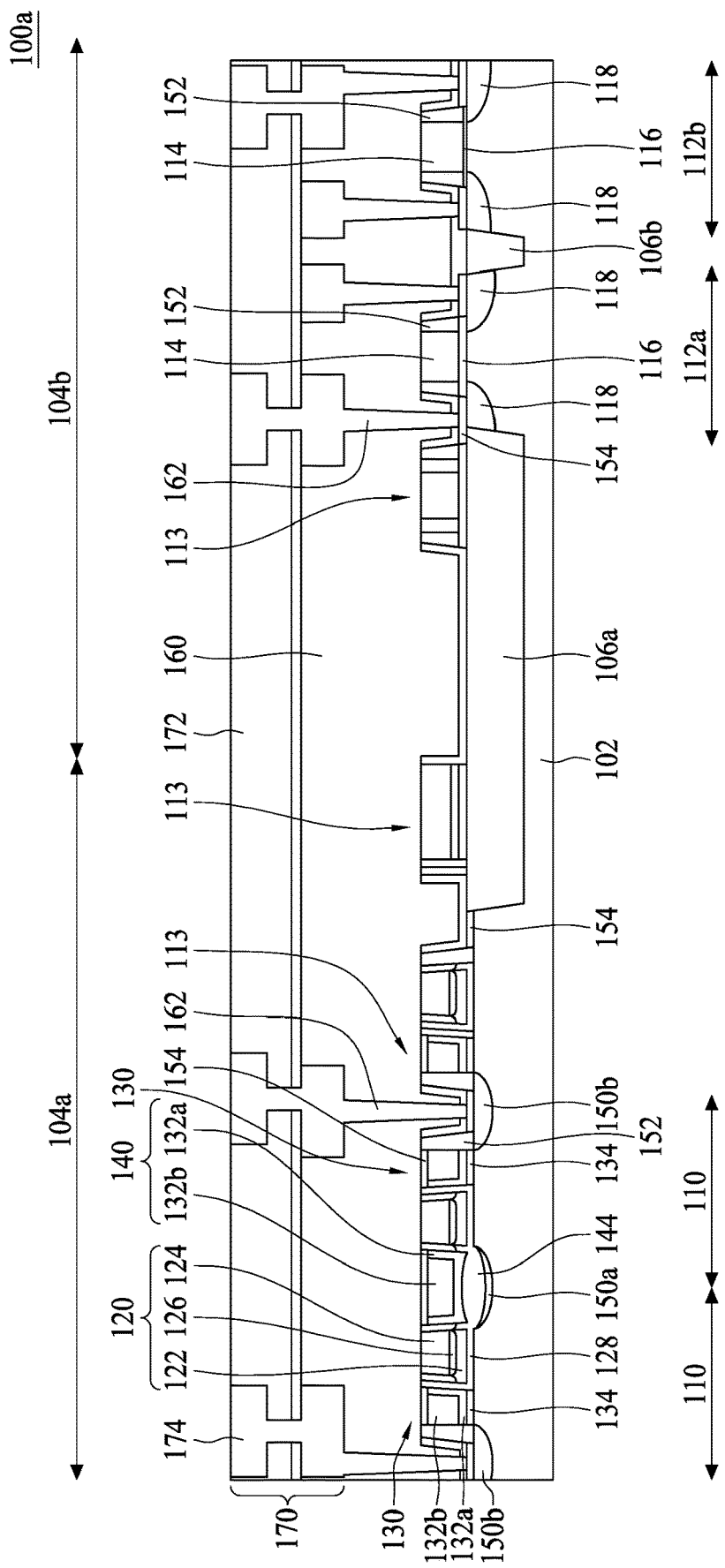
FIG. 1 is a schematic drawing illustrating a cross-sectional view of a semiconductor structure for memory devices according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features, and the scope of the disclosure is defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A flash memory includes an array of flash memory devices and logic devices supporting operation of the flash memory devices. To integrate the array of flash memory devices and the logic devices, an embedded flash memory approach is developed. In some embodiments, the embedded flash memory devices can be formed with polysilicon gates insulated by silicon dioxide, as well as logic devices, such as, for example, address decoders or read/write circuitry.

In the forming of embedded flash memory devices, gate stacks may be formed over a substrate, and a polysilicon layer for forming a poly-gate, i.e., a select gate for flash memory or a control gate for SONOS memory, is deposited over the substrate and fills gaps between the gate stacks. Subsequently, the polysilicon layer is etched back and a hard mask layer is formed over the thinned polysilicon layer. The polysilicon layer is patterned through the hard mask layer to form the select gate or the control gate. It is found that a seam or a void may be formed in the polysilicon layer when filling the gaps between the gate stacks. The seam becomes a recess after the etching back operation and the recess is filled with the hard mask layer. The hard mask layer filling the recess is referred to as a mask residue, and mask residue obstructs patterning of the polysilicon layer. Consequently, silicon residue is left over the substrate, and creates a defect, which adversely impacts yield.

The present disclosure provides a semiconductor structure and a method for forming the same to mitigate the silicon residue defect. According to some embodiments of the present disclosure, polysilicon layers having different dopant concentrations are formed to fill the gap between the gate structures, and thus different etching rates are provided. Due to the difference in etching rates, a profile of the polysilicon layers is modified during the etching back operation. In some embodiments, even if a seam or void is formed during the forming of the polysilicon layer, the recess issue can be mitigated after the etching back operation. Consequently, the mask residue issue is mitigated and the silicon residue defect is mitigated, and thus yield is improved.

FIG. 1 is a schematic drawing illustrating a cross-sectional view of a semiconductor structure for memory devices according to aspects of the present disclosure. In some embodiments, a semiconductor structure 100a is provided. The semiconductor structure 100a includes a substrate 102, and a memory region 104a and a peripheral region 104b are defined over the substrate 102. In some embodiments, the substrate 102 can include bulk substrate of silicon, germanium, or group III and group V elements. In other embodiments, the substrate 102 can include a semiconductor-on-insulator (SOI) substrate, but the disclosure is not limited thereto. The semiconductor structure 100a includes memory devices 110 located in the memory region 104a and devices 112a/112b located in the peripheral region 104b. In some embodiments, the device 112a can be a power device while the device 112b can be a core device, but the disclosure is not limited thereto. The semiconductor structure 100a can further include isolation structures 106a and 106b disposed in the substrate 102. The isolation structure 106a can be located between the memory region 104a and the peripheral region 104b to electrically isolate the memory region 104a and the peripheral region 104b from each other, while the isolation structure 106b can be located in the peripheral region 104b to electrically isolate the devices 112a and 112b from each other. Additionally, dummy structures 113 can be disposed over the substrate 102 and/or the isolation structure 106a, as shown in FIG. 1, but the disclosure is not limited thereto.

Referring to FIG. 1, each memory device 110 can include a first gate structure 120 over the substrate 102, a second gate structure 130 adjacent to the first gate structure 120, and a third gate structure 140 adjacent to the first gate structure 120. As shown in FIG. 1, the first gate structure 120 is disposed between the second gate structure 130 and the third gate structure 140. In some embodiments, the first gate structure 120 includes a floating gate 122 over the substrate 102, a control gate 124 over the floating gate 122, and a dielectric structure 126 between the floating gate 122 and the control gate 124. Further, the floating gate 122 is electrically isolated from the substrate 102 by a dielectric layer 128. The second gate structure 130 is a select gate and is electrically isolated from the substrate 102 by a dielectric layer 134. The third gate structure 140 is an erase gate and is electrically isolated from the substrate 102 by an isolation 144. A first doped region 150a and a second doped region 150b are disposed in the substrate 102. The third gate structure 140 is disposed over the first doped region 150a and is electrically isolated from the first doped region 150a by the isolation 144. The first gate structure 120 and the second gate structure 130 are disposed between the first doped region 150a and the second doped region 150b. Further, the first gate structure 120 is disposed between the second gate structure 130 and the first doped region 150a, while the second gate structure 130 is disposed between the second doped region 150b and the first gate structure 120. In some embodiments, the first doped region 150a is referred to as a source region in the memory device 110 and the second doped region 150b is referred to as a drain region in the memory device 110. In some embodiments, two memory devices 110 share one source region 150a, as shown in FIG. 1.

In some embodiments, the second gate structure 130 and the third gate structure 140 can include similar compositions, which will be detailed in the following description. In other embodiments, the second gate structure 130 and the third gate structure 140 can include different compositions, which will be detailed in the following description.

Still referring to FIG. 1, the second gate structure 130, i.e. the select gate, includes a first layer 132a and a second layer 132b. As shown in FIG. 1, the first layer 132a is disposed between the first gate structure 120 and the second layer 132b, and between the substrate 102 and the second layer 132b. In some embodiments, the first layer 132a may include an L shape, but the disclosure is not limited thereto.

The third gate structure 140, i.e., the erase gate, includes a first layer 132a and a second layer 132b. As mentioned above, the third gate structure 140 may include a composition similar to that of the second gate structure 130. In some embodiments, compositions of the first layer 132a and the second layer 132b of the third gate structure 140 are the same as compositions of the first and second layers 132a and 132b of the second gate structure; therefore, details of the first and second layers 132a and 132b are omitted in the description for brevity. In some embodiments, a difference may be observed between the first layer 132a of the third gate structure 140 and the first layer 132a of the second gate structure 130. That is, the first layer 132a of the second gate structure 130 may include an L shape, but the first layer 132a of the third gate structure 140 may include a U shape, but the disclosure is not limited thereto.

The first layer 132a and the second layer 132b of the second gate structure 130 may include a same semiconductor material, for example but not limited thereto, polysilicon. Further, the first layer 132a and the second layer 132b of the second gate structure 130 may include same dopants. In some embodiments, when the second gate structure 130 is an n-type gate structure, the first layer 132a and the second layer 132b may include the same n-type dopants such as phosphorous (P), arsenic (As) or antimony (Sb), but the disclosure is not limited thereto. In some alternative embodiments, when the second gate structure 130 is a p-type gate structure, the first layer 132a and the second layer 132b may include the same p-type dopants such as boron (B), but the disclosure is not limited thereto. Significantly, although the first layer 132a and the second layer 132b include the same dopants, a dopant concentration of the first layer 132a is different from a dopant concentration of the second layer 132b. It should be noted that when the second gate structure 130 is the n-type gate structure, the dopant concentration of the second layer 132b is less than the dopant concentration of the first layer 132a. For example but not limited thereto, for the n-type gate structure, the dopant concentration of P in the first layer 132a is greater than approximately 1E19 $cm^{-3}$, and the dopant concentration of P in the second layer 132b is less than approximately 5E18 $cm^{-3}$. In contrast, when the second gate structure 130 is the p-type gate structure 130, the dopant concentration of the second layer 132b is greater than the dopant concentration of the first layer 132a. For example but not limited thereto, for the p-type gate structure 130, the dopant concentration of B in the first layer 132a is less than approximately 5E18 $cm^{-3}$, and the dopant concentration of B in the second layer 132b is greater than approximately 1E19 $cm^{-3}$. In some embodiments, a thickness of the second layer 132b is greater than a thickness of the first layer 132a. In some embodiments, a ratio of the thickness of the second layer 132b to the thickness of the first layer 132a is approximately 2:1, but the disclosure is not limited thereto. For example but not limited thereto, the thickness of the first layer 132a can be between approximately 100 Å and approximately 1000 Å, and the thickness of the second layer 132b can be between approximately 100 Å and approximately 2000 Å. Additionally, a width of the first layer 132a exposed through a top surface of the second gate structure 130 is less than a width of the second layer 132b exposed through the top surface of the second gate structure 130.

As semiconductor feature sizes get smaller and smaller, the logic devices of such embedded memory devices are reaching their performance limits. Therefore, high-k metal gate (HKMG) technology is adopted in some embodiments. HKMG technology uses a metal gate separated from the underlying substrate by a high dielectric constant (relative to silicon dioxide) material. The high k material reduces leakage current and increases effect of fermi-level pinning and allows the gate to be operated at lower threshold voltages. Further, the high-k material and the metal gate together reduce power consumption.

Referring to FIG. 1, the devices 112a and 112b can each include a metal gate 114, a gate dielectric layer 116 and source/drain regions 118. Additionally, the power device 112a can have a gate dielectric layer 116 thicker than that of the core device 112b. The metal gate 114 can include a p-type or an n-type work function metal layer and gap-filling metal layer. In some embodiments, the metal gate 114 can include barrier layers or an etch stop layer, though not shown.

It should be noted that a top surface of the substrate 102 in the memory region 104a and a top surface of the substrate 102 in the peripheral region 104b are at different levels. In other words, top surfaces of the first and second doped regions 150a and 150b of the memory devices 110 may be lower than top surfaces of the source/drain regions 118 of the device 112a and 112b. In some embodiments, a step height between the top surfaces of the first/second doped regions 150a/150b and the top surfaces of the source/drain regions 118 can be between approximately 300 Å and approximately 2000 Å, but the disclosure is not limited thereto.

In some embodiments, spacers 152 can be formed over sidewalls of each gate structure 120, 130, 140 and 114. In some embodiments, metal salicide 154 may be formed on top surfaces of the second gate structure 130, the third gate structure 140, the second doped region 150b and the source/drain regions 118, as shown in FIG. 1. In some embodiments, an interlayer dielectric (ILD) layer 160 can be formed over the substrate 102 to cover the memory devices 110 and the devices 112a and 112b. In some embodiments, connecting structures 162 can be formed in the ILD layer 160. The connecting structure 162 is formed to electrically connect the second doped region 150b of the memory devices 110 to an interconnect structure 170 and to electrically connect the source/drain regions 118 of the devices 112a and 112b to the interconnect structure 170. In some embodiments, the interconnect structure 170 can include dielectric layers 172 and conductive features 174, which include metal layers and vias.

Figure 2:
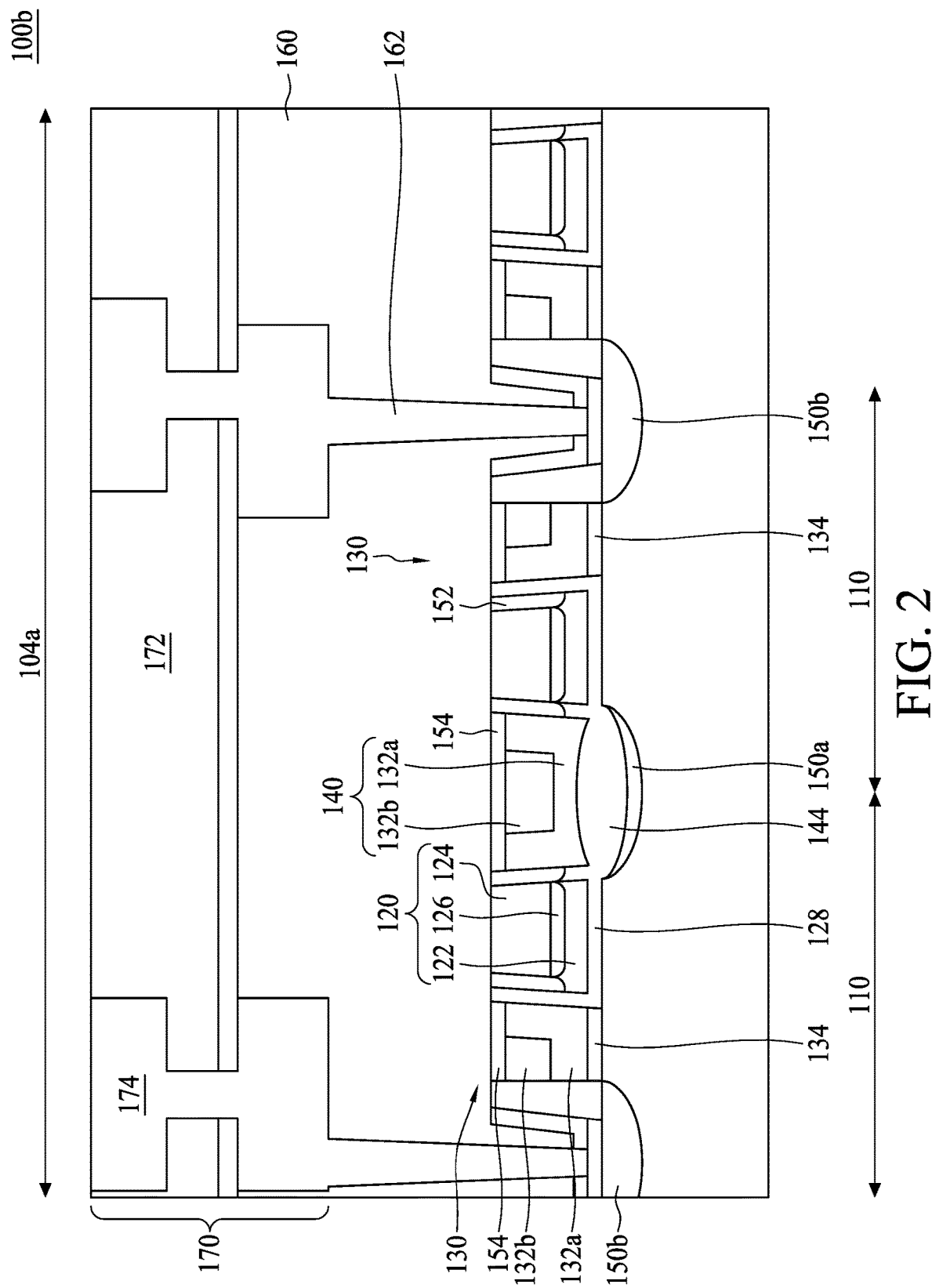
FIG. 2 is a schematic drawing illustrating a cross-sectional view of a semiconductor structure for memory devices according to aspects of the present disclosure.

FIG. 2 is a schematic drawing illustrating a cross-sectional view of a semiconductor structure for memory devices according to aspects of the present disclosure. In some embodiments, a semiconductor structure 100b with memory devices 110 is provided. It should be noted that same elements in FIGS. 1 and 2 are depicted by the same numerals, and details of the same elements shown in FIGS. 1 and 2 are omitted in the description for brevity. Further, the peripheral region 104b is omitted in FIG. 2 for brevity. In some embodiments, in the second gate structure 130, the thickness of the first layer 132a is less than the thickness of the second layer 132b. However, a width of the first layer 132a exposed through a top surface of the second gate structure 130 may be the same as a width of the second layer 132b exposed through the top surface of the second gate structure 130, as shown in FIG. 2. In some embodiments, the first layer 132a of the third gate structure 140 may include same composition as the first layer 132a of the second gate structure 130, and the second layer 132b of the third gate structure 140 may include same composition as the second layer 132b of the second gate structure 130. In contrast to the second gate structure 130, in the third gate structure 140, a thickness of the first layer 132a and a thickness of the second layer 132b may be the same, as shown in FIG. 2. Additionally, the thickness of the first layer 132a of the second gate structure 130 is substantially the same as the thickness of the first layer 132a of the third gate structure 140, while the thickness of the second layer 132b of the second gate structure 130 is greater than the thickness of the second layer 132b of the third gate structure 140.

Figure 3:
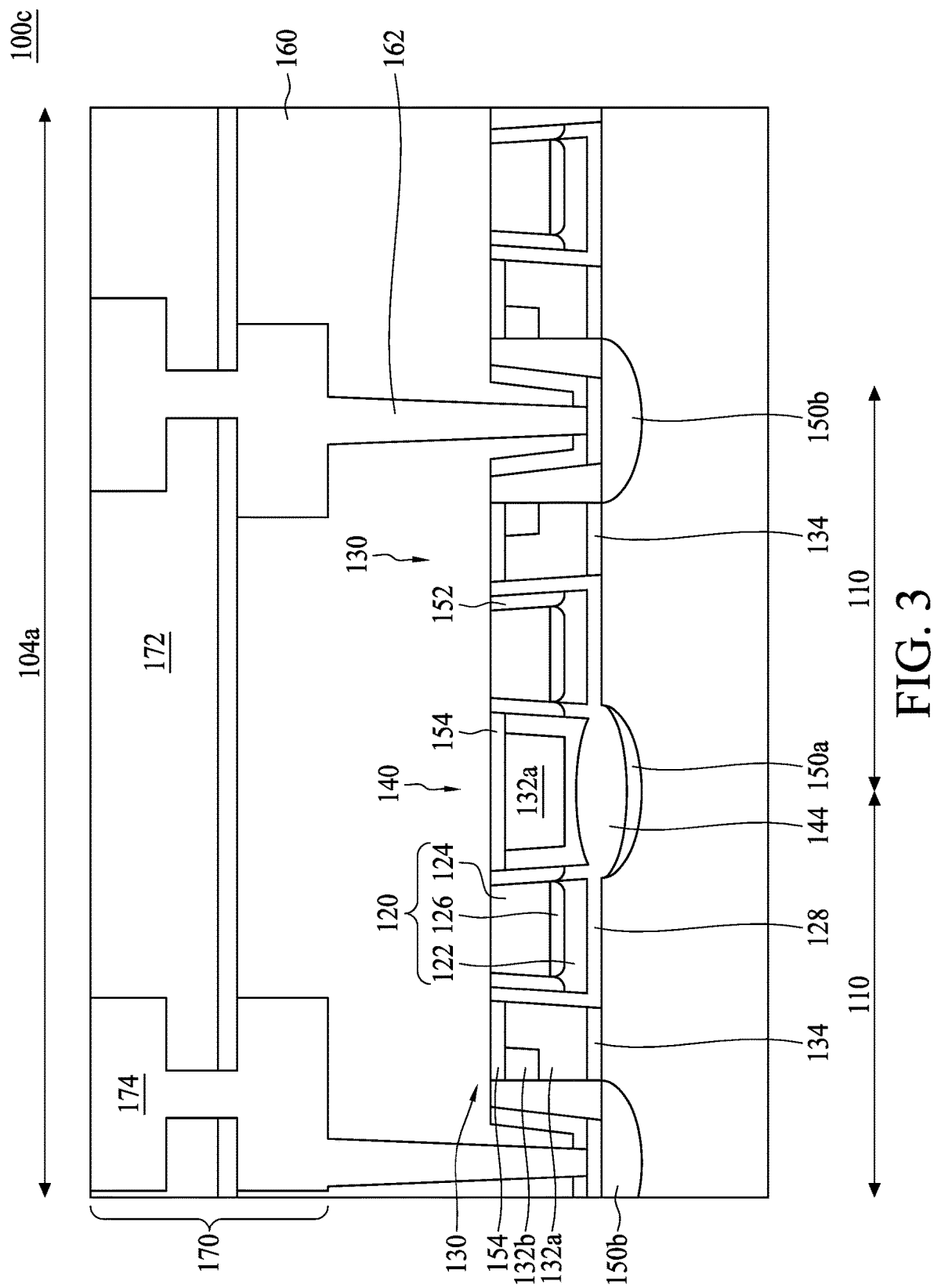
FIG. 3 is a schematic drawing illustrating a cross-sectional view of a semiconductor structure for memory devices according to aspects of the present disclosure.

FIG. 3 is a schematic drawing illustrating a cross-sectional view of a semiconductor structure for memory devices according to aspects of the present disclosure. In some embodiments, a semiconductor structure 100c with memory devices 110 is provided. It should be noted that same elements in FIGS. 1 and 3 are depicted by the same numerals, and details of the same elements shown in FIGS. 1 and 3 are omitted in the description for brevity. Further, the peripheral region 104b is omitted in FIG. 3 for brevity. In some embodiments, in the second gate structure 130, a thickness of the first layer 132a is greater than a thickness of the second layer 132b. In some embodiments, in the second gate structure 130, a width of a topmost surface of the first layer 132a is also greater than a width of the topmost surface of the second layer 132b, as shown in FIG. 3. In some embodiments, the third gate structure 140 may include a first layer 132a, which includes a composition the same as that of the first layer 132a of the second gate structure 130.

Figure 4:
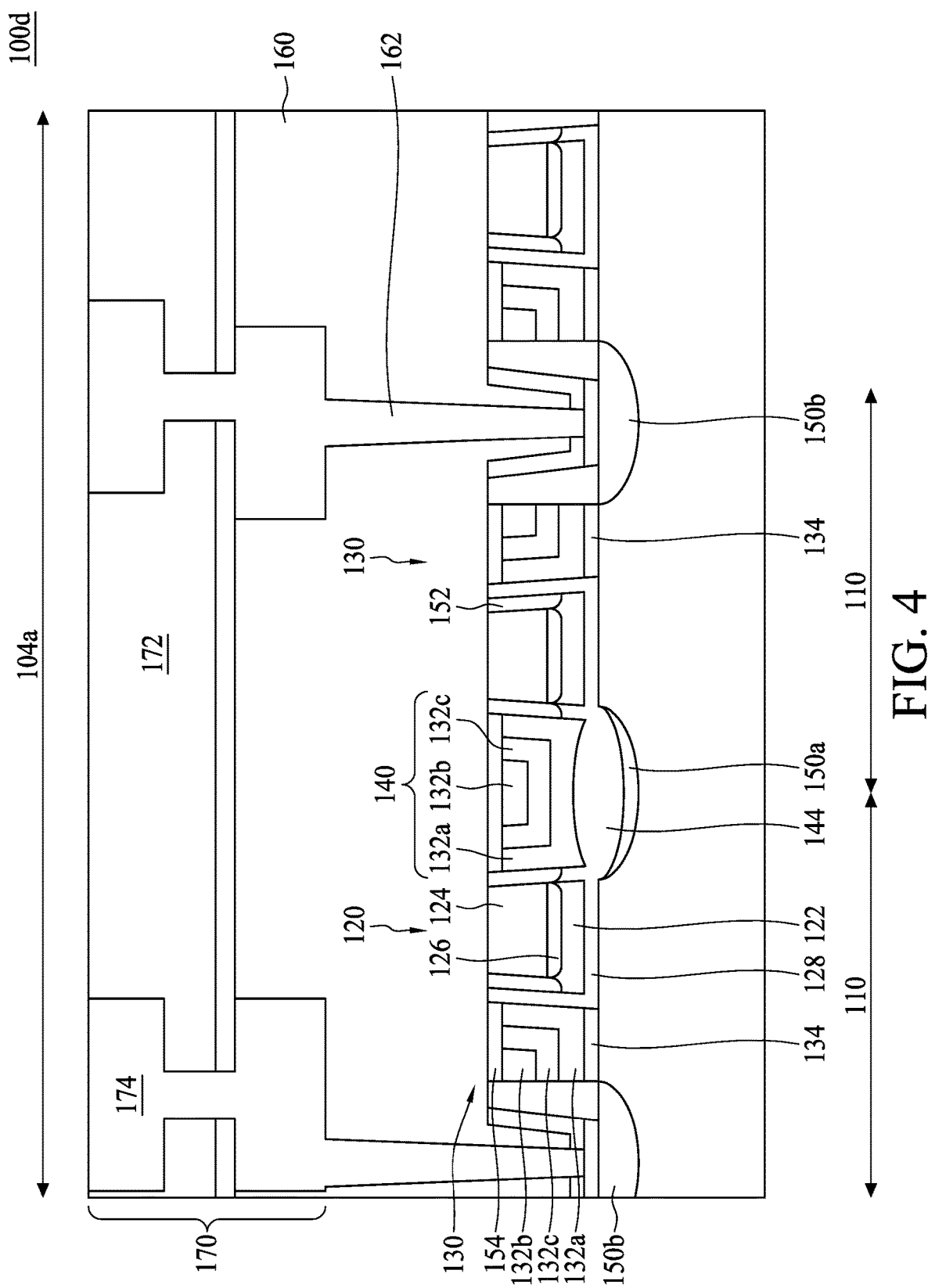
FIG. 4 is a schematic drawing illustrating a cross-sectional view of a semiconductor structure for memory devices according to aspects of the present disclosure.

FIG. 4 is a schematic drawing illustrating a cross-sectional view of a semiconductor structure for memory devices according to aspects of the present disclosure. In some embodiments, a semiconductor structure 100d with memory devices 110 is provided. It should be noted that same elements in FIGS. 1 and 4 are depicted by the same numerals, and details of the same elements shown in FIGS. 1 and 4 are omitted in the description for brevity. Further, the peripheral region 104b is omitted in FIG. 4 for brevity. In some embodiments, the second gate structure 130 further includes a third layer 132c disposed between a first layer 132a and a second layer 132b. Similarly, the third gate structure 140 includes a third layer 132c disposed between the first layer 132a and the second layer 132b. The third layer 132c of the second gate structure 130 includes the same semiconductor material and dopants as those of the first and second layers 132a and 132b of the second gate structure 130. Similarly, the third layer 132c of the third gate structure 140 includes the same semiconductor material and dopants as those of the first and second layers 132a and 132b of the third gate structure 140. Significantly, a dopant concentration of the third layer 132c of the second and third gate structures 130 and 140 is between the dopant concentration of the first layer 132a and the dopant concentration of the second layer 132b of the second and third gate structures 130 and 140. The dopant concentration of the third layer 132c of the second gate structure 130 and the dopant concentration of the third layer 132c of the third gate structure 140 are the same. In some embodiment, in the second gate structure 130, a thickness ratio between the first layer 132a, the second layer 132b and the third layer 132c is 1:1:1, but the disclosure is not limited thereto. In some embodiments, the thickness of the second layer 132b of the second gate structure 130 is greater than thicknesses of the first layer 132a and the third layer 132c of the second gate structure 130, as shown in FIG. 4. Thicknesses of the first, second and third layers 132a, 132b and 132c of the third gate structure 140 can be similar to those of the second gate structure 130, but the disclosure is not limited thereto. In some embodiments, the first layer 132a and the third layer 132c of the second gate structure 130 have L shapes, while the first layer 132a and the third layer 132c of the third gate structure 140 have U shapes, but the disclosure is not limited thereto.

Figure 5:
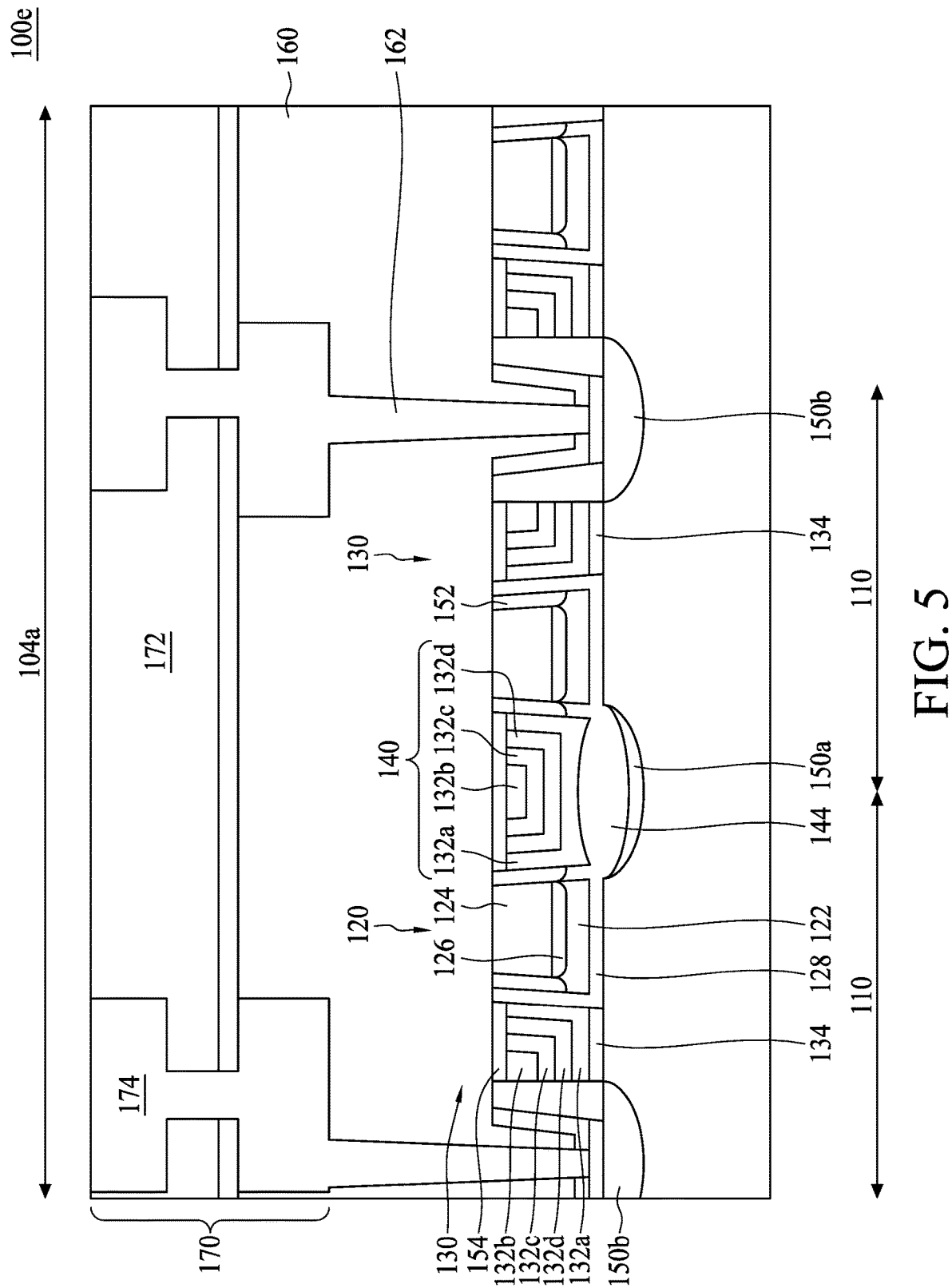
FIG. 5 is a schematic drawing illustrating a cross-sectional view of a semiconductor structure for memory devices according to aspects of the present disclosure.

FIG. 5 is a schematic drawing illustrating a cross-sectional view of a semiconductor structure for memory devices according to aspects of the present disclosure. In some embodiments, a semiconductor structure 100e with memory devices 110 is provided. It should be noted that same elements in FIGS. 4 and 5 are depicted by the same numerals, and details of the same elements shown in FIGS. 4 and 5 are omitted for brevity in the description. Further, the peripheral region 104b is omitted in FIG. 5 for brevity. In some embodiments, the second gate structure 130 further includes a third layer 132c and a fourth layer 132d disposed between a first layer 132a and a second layer 132b. Similarly, the third gate structure 140 includes a third layer 132c and a fourth layer 132d disposed between the first layer 132a and the second layer 132b. The third and the fourth layers 132c and 132d of the second gate structure 130 include the same semiconductor material and dopants as those of the first and second layers 132a and 132b of the second gate structure 130. Similarly, the third and the fourth layers 132c and 132d of the third gate structure 140 include the same semiconductor material and dopants as those of the first and second layers 132a and 132b of the third gate structure 140. The fourth layer 132d of the second gate structure 130 is adjacent to the third layer 132c of the second gate structure 130, and the fourth layer 132d of the third gate structure 140 is adjacent to the third layer 132c of the third gate structure 140. In both of the second and third gate structures 130 and 140, a dopant concentration of the fourth layer 132d is greater than the dopant concentration of the third layer 132c, but between the dopant concentration of the first layer 132a and the dopant concentration of the second layer 132b. The dopant concentration of the fourth layer 132d of the second gate structure 130 and the dopant concentration of the fourth layer 132d of the third gate structure 140 are the same. In some embodiments, a thickness ratio between the first layer 132a, the second layer 132b, the third layer 132c and the fourth layer 132d of the second gate and third gate structures 130 and 140 is 1:1:1:1, but the disclosure is not limited thereto. In some embodiments, the fourth layer 132d of the second and third gate structures 130 and 140 can be disposed between the third layer 132c and second layer 132b, though not shown. In some alternative embodiments, the fourth layer 132d of the second and third gate structures 130 and 140 can be disposed between the third layer 132c and first layer 132a, as shown in FIG. 5.

In some embodiments, the dopant concentration can be gradually reduced from the first layer 132a, the fourth layer 132d and the third layer 132c to the second layer 132b for an n-type gate structure. In some embodiments, the first layer 132a, which has the highest dopant concentration among the four layers, is disposed nearest to the first gate structure 120 and the substrate 102 for the n-type gate structure. The second layer 132b, which has the lowest dopant concentration among the four layers, is disposed farthest from the first gate structure 120 and the substrate 102 for the n-type gate structure. Despite the arrangement of the two layers in the embodiment depicted, arrangement of the third layer 132c and the fourth layer 132d is not limited. The arrangement of the first, second, third and fourth layers 132a, 132b, 132c and 132d of the third gate structure 140 can be the same as that of the second gate structure 130. In some embodiments, the dopant concentration can be gradually increased from the first layer 132a, the fourth layer 132d and the third layer 132c to the second layer 132b for a p-type gate structure. In some embodiments, the first layer 132a, which has the lowest dopant concentration among the four layers, is disposed nearest to the first gate structure 120 and the substrate 102 for the p-type gate structure. The second layer 132b, which has the highest dopant concentration among the four layers, is disposed farthest from the first gate structure 120 and the substrate 102 for the p-type gate structure. Despite the arrangement of the two layers in the embodiment depicted, arrangement of the third layer 132c and the fourth layer 132d is not limited. The arrangement of the first, second, third and fourth layers 132a, 132b, 132c and 132d of the third gate structure 140 can be the same as that of the second gate structure 130. In some embodiments, the first layer 132a, the third layer 132c and the fourth layer 132d of the second gate structure 130 have L shapes, while the first layer 132a, the third layer 132c and the fourth layer 132d of the third gate structure 140 have U shapes, but the disclosure is not limited thereto.

Figure 6:
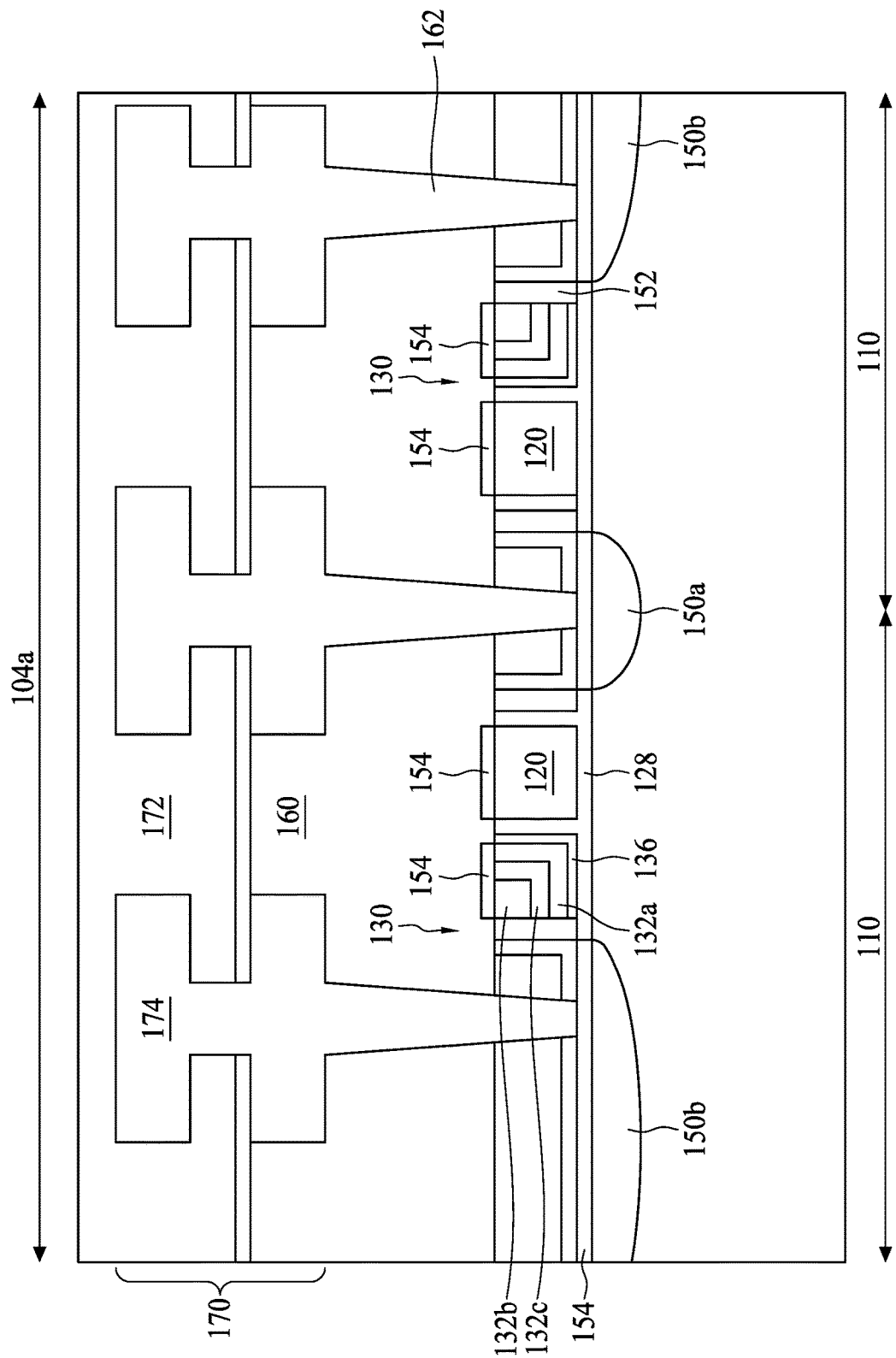
FIG. 6 is a schematic drawing illustrating a cross-sectional view of a semiconductor structure for memory devices according to aspects of the present disclosure.

FIG. 6 is a schematic drawing illustrating a cross-sectional view of a semiconductor structure for memory devices according to aspects of the present disclosure. In some embodiments, a semiconductor structure 100f with memory devices 110 is provided. It should be noted that same elements in FIGS. 1 and 6 are depicted by the same numerals, and details of the same elements shown in FIGS. 1 and 6 are omitted in the description for brevity. Further, the peripheral region 104b is omitted in FIG. 6 for brevity. In some embodiments, the memory device 110 of the semiconductor structure 100f can be a SONOS memory device. Accordingly, the first gate structure 120 is referred to as a select gate and the second gate structure gate 130 is referred to as a control gate. The first gate structure 120 is electrically isolated from the substrate 102 by a dielectric layer 128, while the second gate structure 130 is electrically isolated from the substrate 102 and the first gate structure 120 by an ONO structure 136. The first gate structure 120 can include semiconductor material. In some embodiments, the second gate structure 130 can include a first layer 132a and a second layer 132b that can be similar as those layers described above. In some embodiments, the second gate structure 130 can include a first layer 132a, a second layer 132b and a third layer 132c, which can be similar to layers described above. In some other embodiments, the second gate structure 130 can include a first layer 132a, a second layer 132b, a third layer 132c and a fourth layer 132d, which can be similar to layers described above. In some embodiments, metal salicides 154 are formed over top surfaces of the first gate structure 120, the second gate structure 130, the first doped region 150a and the second doped region 150b, as shown in FIG. 6.

Figure 7:
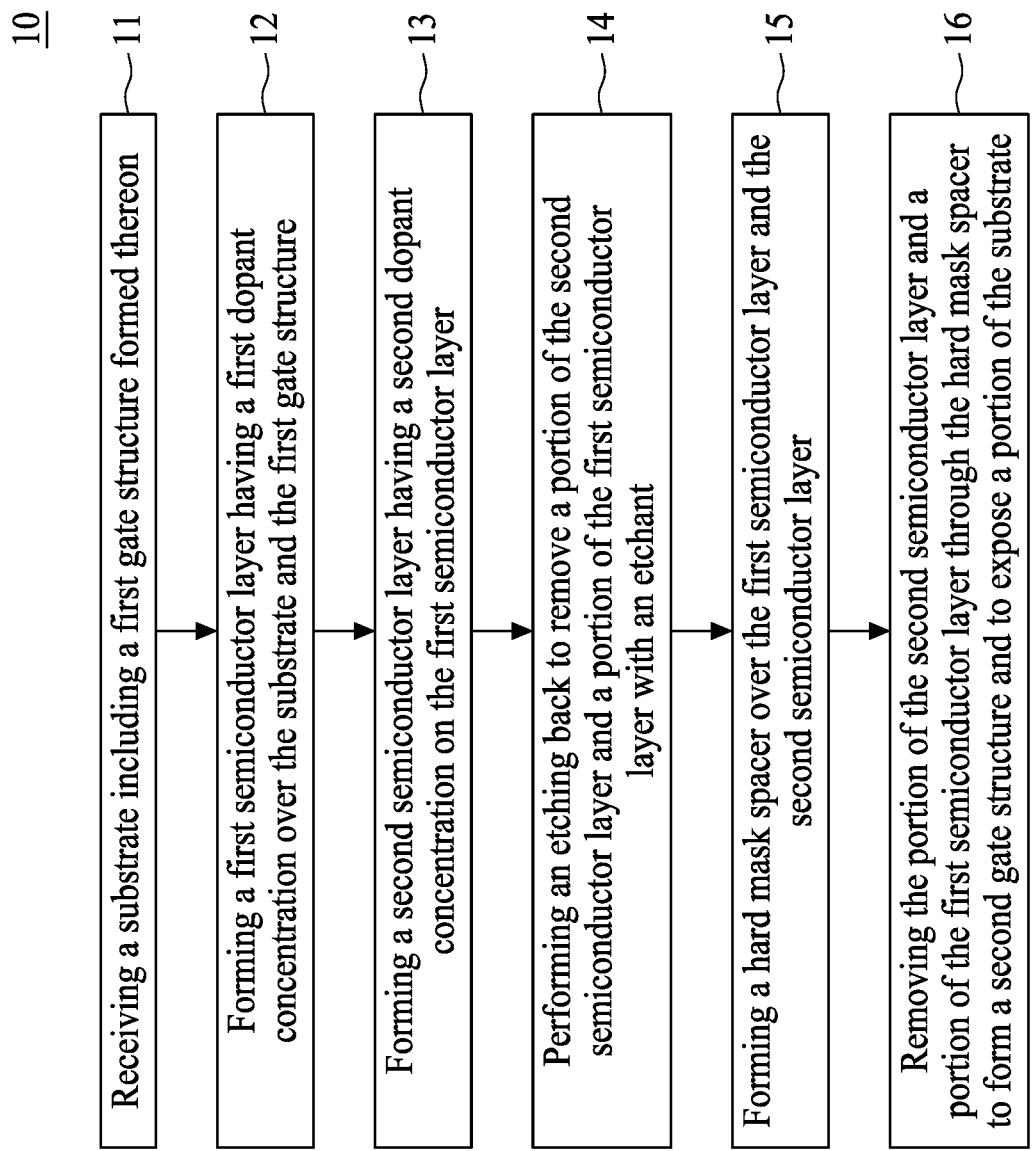
FIG. 7 is a flowchart representing a method for manufacturing a semiconductor structure for a memory device according to aspects of the present disclosure.

FIG. 7 is a flowchart representing a method for manufacturing a semiconductor structure for a memory device 10 according to aspects of the present disclosure. The method 10 includes a number of operations (11, 12, 13, 14, 15 and 16). The method for manufacturing the semiconductor structure for the memory device 10 will be further described according to one or more embodiments. It should be noted that the operations of the method for manufacturing the semiconductor structure for the memory device 10 may be rearranged or otherwise modified within the scope of the various aspects. It should further be noted that additional processes may be provided before, during, and after the method 10, and that some other processes may only be briefly described herein. Thus other implementations are possible within the scope of the various aspects described herein.

At operation 11, a substrate is received. In some embodiments, the substrate includes a first gate structure formed thereon.

At operation 12, a first semiconductor layer is formed over the substrate and the first gate structure. In some embodiments, the first semiconductor layer has a first dopant concentration.

At operation 13, a second semiconductor layer is formed on the first semiconductor layer. In some embodiments, the second semiconductor layer has a second dopant concentration.

At operation 14, an etching back operation is performed to remove a portion of the second semiconductor layer and a portion of the first semiconductor layer with an etchant. In some embodiments, an etching rate of the first semiconductor layer to the etchant is greater than an etching rate of the second semiconductor layer to the etchant.

At operation 15, a hard mask spacer is formed over the first semiconductor layer and the second semiconductor layer. In some embodiments, a portion of the second semiconductor layer is exposed through the hard mask spacer.

At operation 16, the portion of the second semiconductor layer and a portion of the first semiconductor layer are removed through the hard mask spacer to form a second gate structure and expose a portion of the substrate.

Figure 8A:
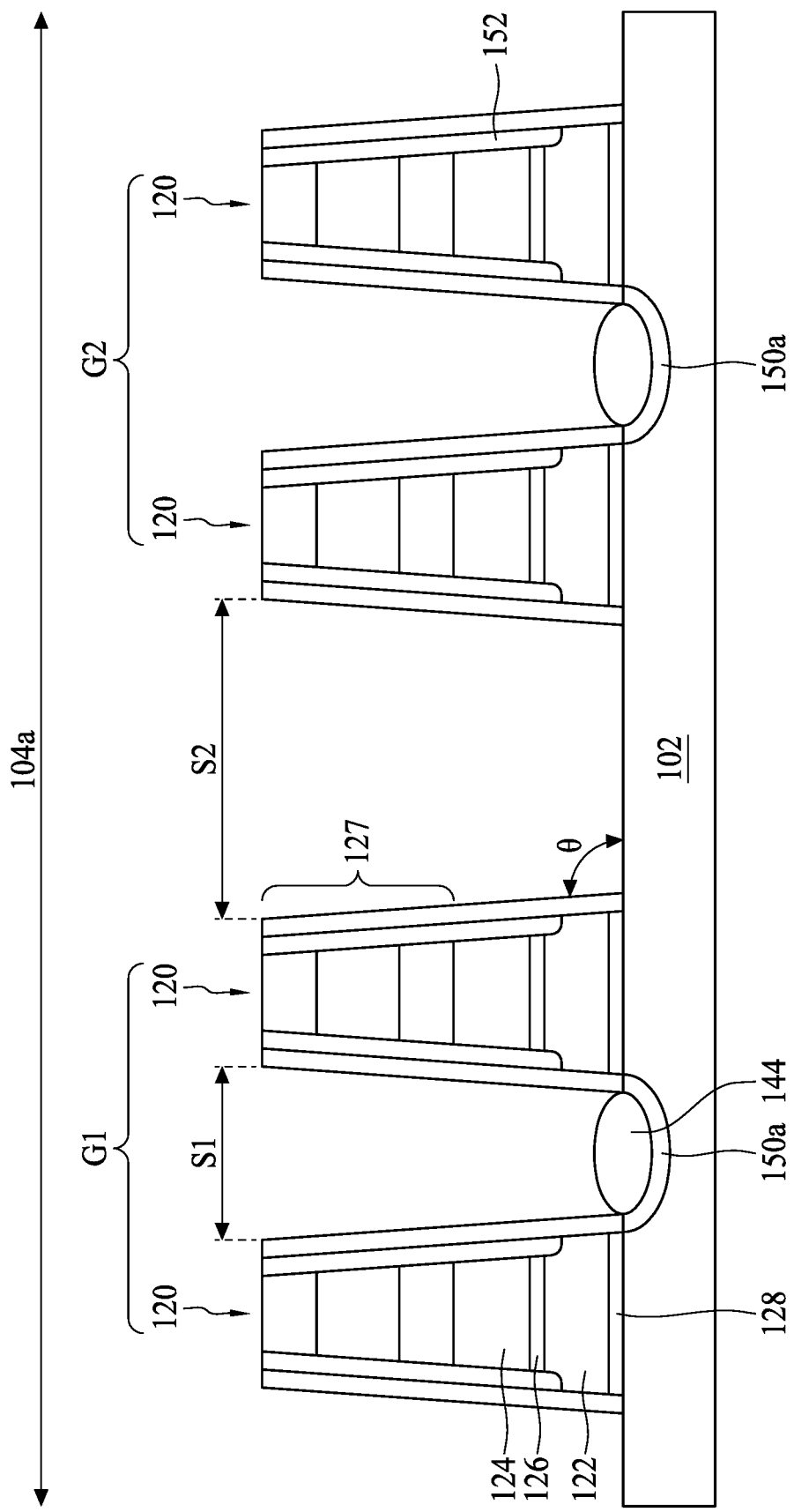
FIG. 8A to FIG. 8K illustrate cross-sectional views of a semiconductor structure for a memory device at different fabrication stages constructed according to aspects of the present disclosure in one or more embodiments.

Referring to FIG. 8A, in some embodiments, a substrate 102 is received. It should be noted that the substrate 102 can include a memory region 104a and a peripheral region 104b, which are separated from each other by an isolation structure 106a. The arrangement of the memory region 104a, the peripheral region 104b and the isolation structure 106a can be similar to those shown in FIG. 1; therefore, the memory region 104a, the peripheral region 104b and the isolation structures 106a, 106b are omitted in FIG. 8A for brevity. A plurality of gate structures 120 is disposed over the substrate 102. In some embodiments, each of the gate structures 120 includes a first gate electrode 122, i.e., a floating gate (FG), separated and electrically isolated from the substrate 102 by a dielectric layer 128. Each of the gate structures 120 includes a second gate electrode 124, i.e., a control gate (CG), separated and electrically isolated from the first gate electrode 122 by a dielectric structure 126. The dielectric layer 128 interposed between the floating gate 122 and the substrate 102 serves as a floating gate dielectric, and the dielectric structure 126 interposed between the floating gate 122 and the control gate 124 serves as an inter-poly dielectric (IPD) isolation. The floating gate 122 and the control gate 124 can include polysilicon, doped polysilicon, and combination thereof, but the disclosure is not limited thereto. The dielectric layer 128 can include an oxide, such as a silicon oxide (SiO), but other materials are acceptable as well. The dielectric structure 126 can include a composite film, such as, an oxide-nitride-oxide (ONO) film, but the disclosure is not limited thereto. A patterned mask structure 127 is formed to define locations and sizes of the gate structures 120. In some embodiments, the patterned mask structure 127 can be a multiple-layered structure, as shown in FIG. 8A, but other materials are acceptable. The gate structures 120 can be grouped in pairs, such as group 1 G1 and group 2 G2. In some embodiments, two gate structures 120 (corresponding to two memory devices) in each group G1, G2 are separated from each other by a spacing distance S1, as shown in FIG. 8A. In some embodiments, the spacing distance S1 is substantially equal to a width of a source line to be formed. The spacing distance S1 and the width of the source line can be designed according to different product requirements. For example, the spacing distance S1 is between approximately 30 nanometers and approximately 800 nanometers, but the disclosure is not limited thereto. Further, the two groups G1 and G2 can be separated from each other by a spacing distance S2, as shown in FIG. 8A. In some embodiments, the spacing distance S2 between the groups G1 and G2 is greater than the spacing distance S1. The spacing distance S2 can be designed according to different product requirements. In some embodiments, the spacing distance S2 is between approximately 50 nanometers and approximately 2000 nanometers, but the disclosure is not limited thereto.

In some embodiments, spacers 152 can be formed over sidewalls of each gate structure 120. The spacers 152 can be formed to cover sidewalls of the control gate 124 and the dielectric structure 126. The spacers 152 are also formed over the patterned mask structure 127 and portions of the floating gate 122 as shown in FIG. 8A. In some embodiments of the present disclosure, the spacers 152 respectively include a multi-layered structure formed by multiple operation processes. For example but not limited thereto, the spacers 152 can be an oxide-nitride-oxide (ONO) multi-layered structure. In some embodiments, a first doped region 150a is formed in the two gate structures 120 in each group G1, G2. In some embodiments, the first doped region 150a serves as a source region, and is shared by the two gate structures 120 in one group G1 or G2. After forming the first doped region 150a, an isolation 144 is formed on the first doped region 150a. In some embodiments, the isolation 144 formed between the two gate structures 120 in one group G1 or G2 forces the adjacent gate structure 120 to be tilted. Consequently, an included angle θ between the gate structure 120 and the substrate 102 may be reduced to less than 90°.

Figure 8B:
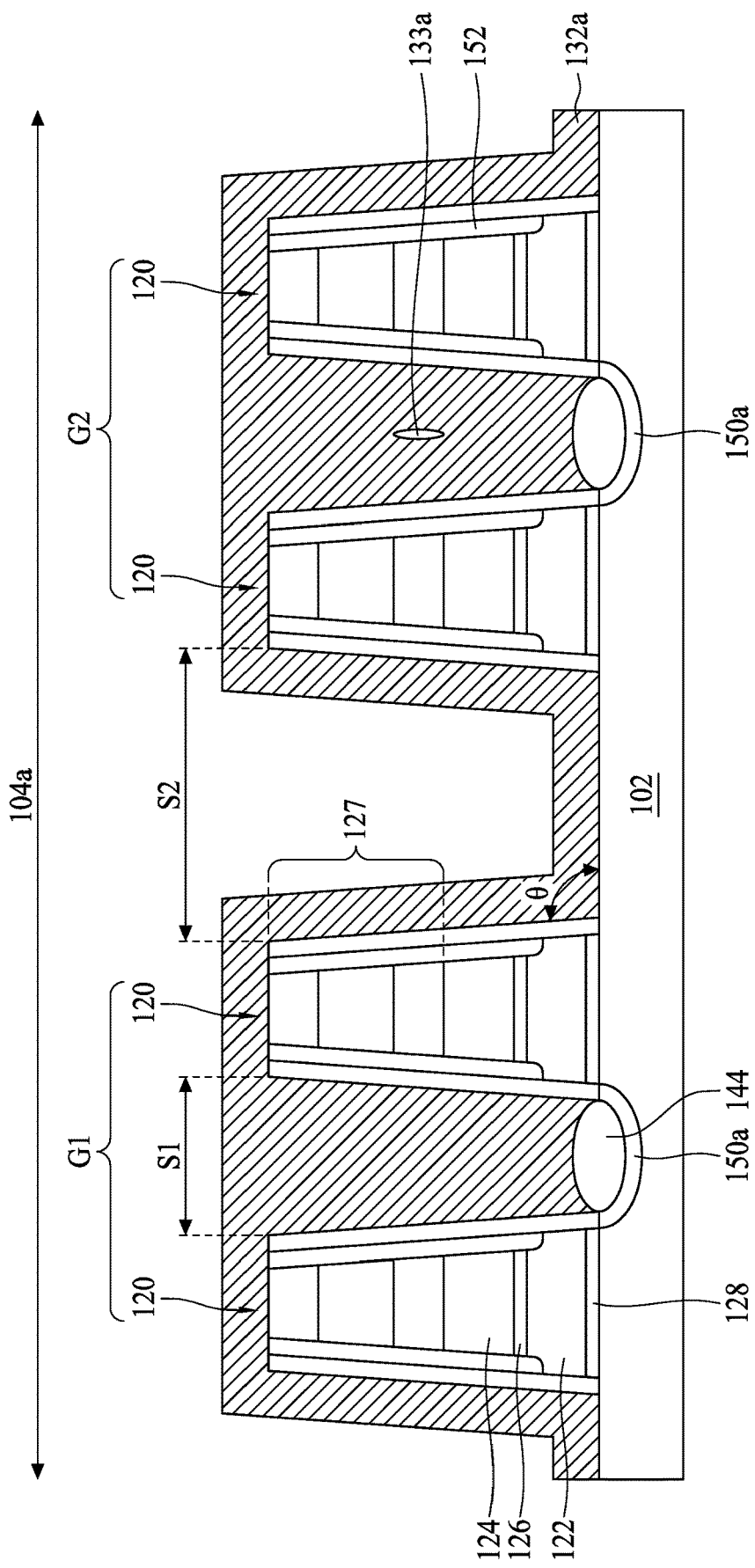

Referring to FIG. 8B, in some embodiments, a dielectric layer (not shown) is formed over the substrate 102, and a first semiconductor layer 132a is formed on the dielectric layer. The first semiconductor layer 132a is formed over the substrate 102 and the gate structures 120. In some embodiments, the first semiconductor layer 132a is formed after the forming of the first doped region 150a and the forming of the isolation 144. The first semiconductor layer 132a can include semiconductor material such as silicon. In some embodiments, the first semiconductor layer 132a can be formed by a chemical vapor deposition (CVD), a low pressure chemical vapor deposition (LPCVD) or the like. Further, the first semiconductor layer 132a includes n-type dopants such as As Sb or P, or p-typed dopants such as B. In some embodiments, the n-type dopants and the p-type dopants can be introduced into the first semiconductor layer 132a by in-situ doping procedures. In some embodiments, when the first semiconductor layer 132a is used to form an n-type gate, a dopant concentration of, for example, P in the first semiconductor layer 132a is greater than approximately 1E19 cm$^{-3}$, but the disclosure is not limited thereto. In some embodiments, when the first semiconductor layer 132a is used to form a p-type gate, a dopant concentration of, for example, B of the first semiconductor layer 132a is less than 5E18 cm$^{-3}$. In some embodiments, a thickness of the first semiconductor layer 132a is between approximately 50 Å and approximately 500 Å. In some embodiments, the first semiconductor layer 132a is conformally formed over the substrate 102 and the gate structures 120. Therefore, the first semiconductor layer 132a covers a top surface of the substrate 102, top surfaces of the gate structures 120, a top surface of the isolation 144 and sidewalls of the gate structures 120. In some embodiments, vacant space between the two gate structures 120 in each group G1 or G2 may be filled with the first semiconductor layer 132a, but the disclosure is not limited thereto. In some embodiments, a seam or a void 133a may be formed within the first semiconductor layer 132a, as shown in FIG. 8B.

Figure 8C:
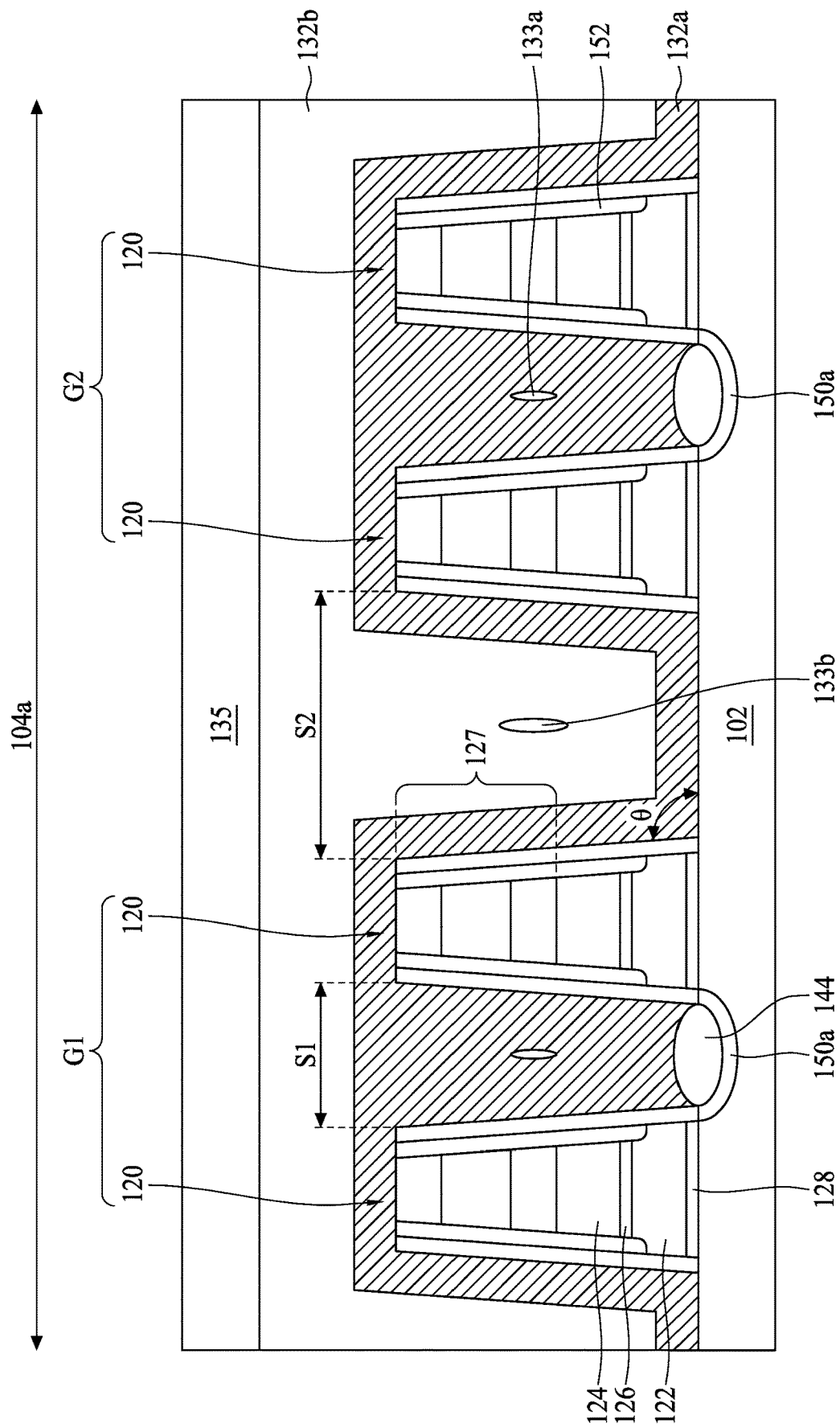

Referring to FIG. 8C, in some embodiments, a second semiconductor layer 132b is formed on the first semiconductor layer 132a. The second semiconductor layer 132b can include the same semiconductor material as that included in the first semiconductor layer 132a. In some embodiments, the second semiconductor layer 132b can also be formed by a CVD, an LPCVD, or the like. In some embodiments, the second semiconductor layer 132b can include undoped semiconductor material. In other embodiments, the second semiconductor layer 132b includes n-type dopants such as As, Sb or P, or p-type dopants such as B. In some embodiments, the n-type dopants and the p-type dopants can be introduced into the second semiconductor layer 132b by in-situ doping procedures. Significantly, when the second semiconductor layer 132b is used to form an n-type gate, a dopant concentration of the second semiconductor layer 132b is less than the dopant concentration of the first semiconductor layer 132a. In some embodiments, the dopant concentration of the n-type dopants, such as P, of the second semiconductor layer 132b is less than approximately 5E18 cm$^{-3}$, but the disclosure is not limited thereto. In contrast, when the second semiconductor layer 132b is used to form a p-type gate, the dopant concentration of the second semiconductor layer 132b is greater than the dopant concentration of the first semiconductor layer 132a. In some embodiments, the dopant concentration of, for example, B of the second semiconductor layer 132b is greater than 1E19 cm$^{-3}$. If the dopant concentration of the second semiconductor layer 132b is less than 1E19 cm$^{-3}$, the dopant concentration is not sufficient to alter an etching rate of the second semiconductor layer 132b. A thickness of the second semiconductor layer 132b is greater than the thickness of the first semiconductor layer 132a. In some embodiments, the thickness of the second semiconductor layer 132b is between approximately 500 Å and approximately 2000 Å, but the disclosure is not limited thereto. In some embodiments, the second semiconductor layer 132b is also conformally formed. In some embodiments, a seam or a void 133b may be formed within the second semiconductor layer 132b, as shown in FIG. 8C. In some embodiments, because the included angle θ is less than 90°, the seam or void 133b is easily formed within the second semiconductor layer 132b.

Additionally, in some embodiments, because the vacant space between the two gate structures 120 in one group G1 or G2 is filled with the first semiconductor layer 132a, the second semiconductor layer 132b is absent between the two gate structures 120 in the one group G1 or G2.

Still referring to FIG. 8C, in some embodiments, a sacrificial layer 135 is formed over the second semiconductor layer 132b. The sacrificial layer 135 can include a photoresist material, but the disclosure is not limited thereto. The sacrificial layer 135 is formed to achieve a planar top surface for subsequent etching processes. In some embodiments, the sacrificial layer 135 can be formed by coating techniques such as spin-on. A top surface of the formed sacrificial layer 135 is substantially flat.

Figure 8D:
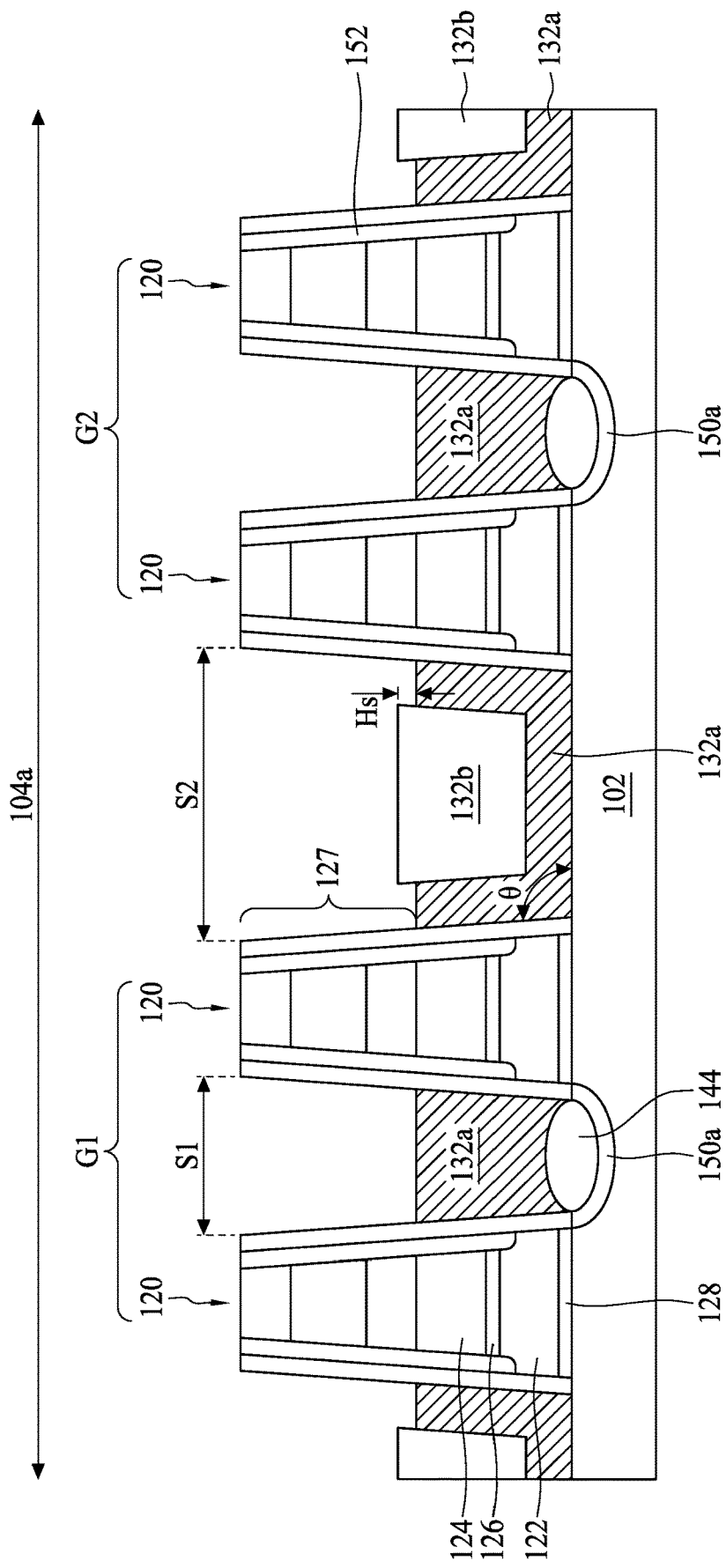

Referring to FIG. 8D, an etching back operation is performed to remove the sacrificial layer 135, a portion of the second semiconductor layer 132b and a portion of the first semiconductor layer 132a with an etchant. As shown in FIG. 8D, the etchant is used to remove the sacrificial layer 135 entirely. Further, the etchant removes a portion of the second semiconductor layer 132b and a portion of the first semiconductor layer 132a, such that upper portions of the gate structures 120 are exposed. In some embodiments, due to the different dopant concentrations of the first and second semiconductor layers 132a and 132b, an etching rate of the first semiconductor layer 132a upon exposure to the etchant is different from an etching rate of the second semiconductor layer 132b upon exposure to the etchant. Significantly, the etching rate of the first semiconductor layer 132a upon exposure to the etchant is greater than the etching rate of the second semiconductor layer 132b upon exposure to the etchant. In some embodiments, when the first and second semiconductor layers 132a and 132b include the n-type dopants, the etching rate of the first semiconductor layer 132a is greater than the etching rate of the second semiconductor layer 132b because the dopant concentration of the first semiconductor layer 132a is greater than the dopant concentration of the second semiconductor layer 132b. In some alternative embodiments, when the first and second semiconductor layers 132a and 132b include the p-type dopants, the etching rate of the first semiconductor layer 132a is greater than the etching rate of the second semiconductor layer 132b because the dopant concentration of the first semiconductor layer 132a is less than the dopant concentration of the second semiconductor layer 132b.

Still referring to FIG. 8D, because the etching rate of the first semiconductor layer 132a is greater than the etching rate of the second semiconductor layer 132b, a greater portion of the first semiconductor layer 132a is removed. In some embodiments, a step height Hs is formed between a top surface of the second semiconductor layer 132b and a top surface of the first semiconductor layer 132a after the etching back operation. The step height Hs is between approximately 0 angstroms and approximately 200 angstroms, but the disclosure is not limited thereto. In some embodiments, the void or seam 133a in the first semiconductor layer 132a and the void or seam 133b in the second semiconductor layer 132b may be removed by the etching back operation.

In some comparative embodiments, when the etching rate of the second semiconductor layer 132b is equal or greater than the etching rate of the first semiconductor layer 132a, a portion of the void or seam 133b may be left by the etching back operation over the semiconductor layer to form a recess. In some comparative embodiments, such recess may be enlarged by the etching back operation.

Figure 8E:
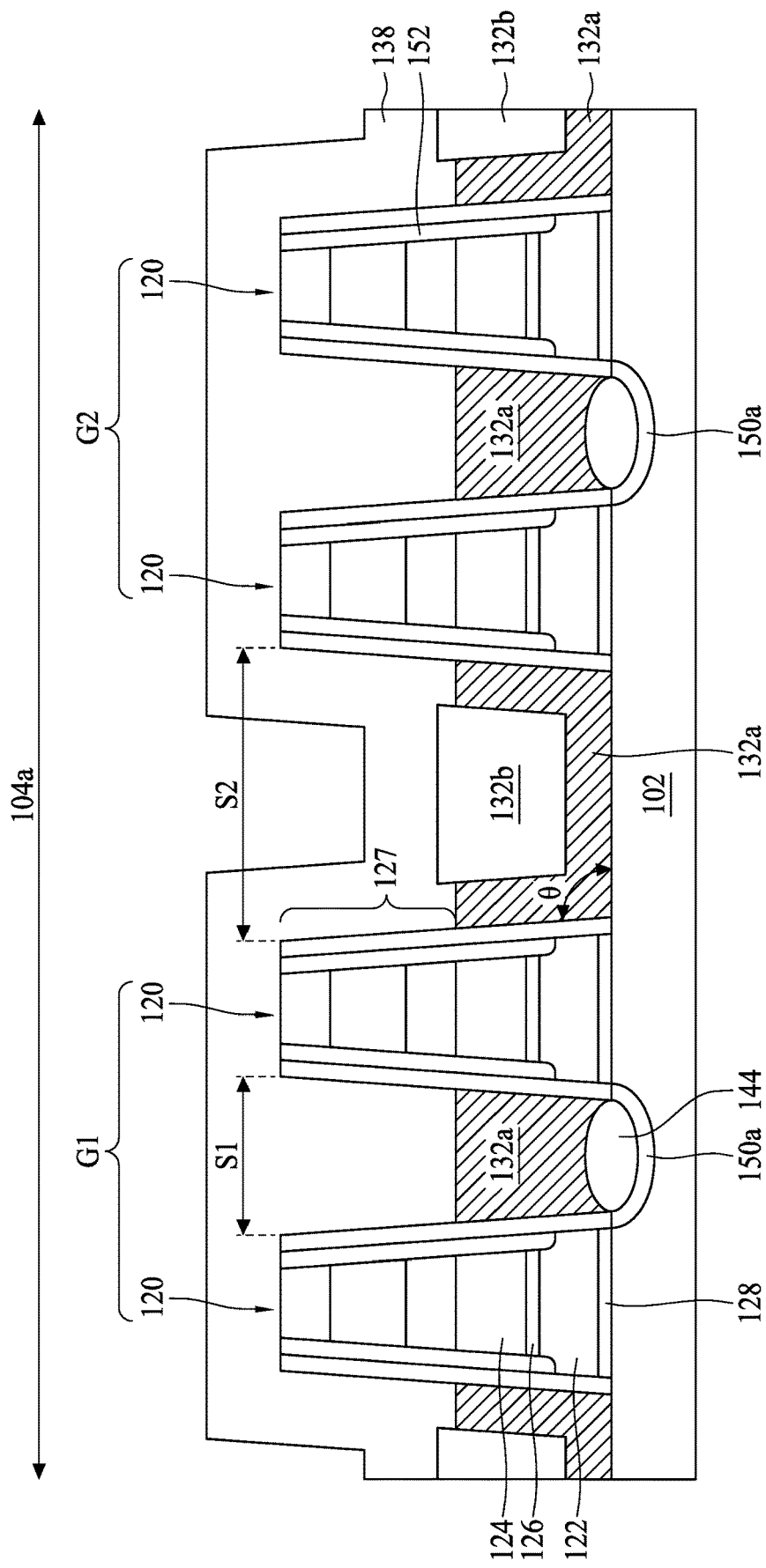

Referring to FIG. 8E, a hard mask layer 138 can be formed over the substrate 102. In some embodiments, the hard mask layer 138 can be conformally formed such that the hard mask layer 138 covers the sidewalls of the gate structure 120, top surfaces of the first semiconductor layer 132a, and top surfaces of the second semiconductor layer 132b. In some embodiments, the hard mask layer 138 includes silicon nitride, but the disclosure is not limited thereto. A thickness of the hard mask layer 138 can be used to define a width of the select gate to be formed. In some embodiments, the thickness of the hard mask layer 138 is between approximately 100 Å and between approximately 3000 Å, but the disclosure is not limited thereto.

Figure 8F:
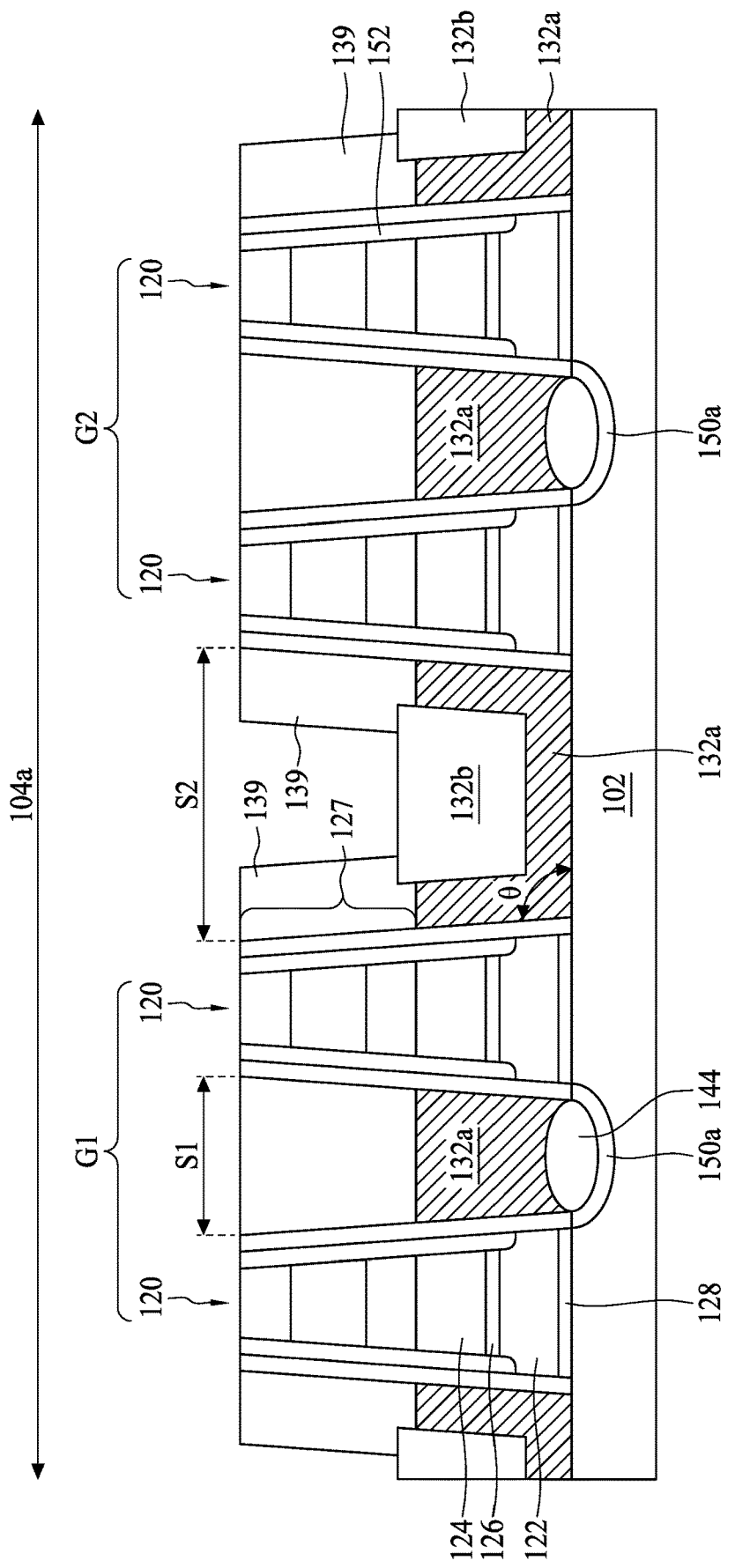

Referring to FIG. 8F, the hard mask layer 138 is etched back to remove a lateral portion thereof and form hard mask spacers 139 over the sidewalls of the gate structures 120. Further, a portion of the second semiconductor layer 132b between the two groups G1 and G2 is exposed through the hard mask spacer 139. However, the first semiconductor layer 132a between the two gate structures 120 in one group G1, G2 is still covered by the hard mask spacer 139.

Figure 8G:
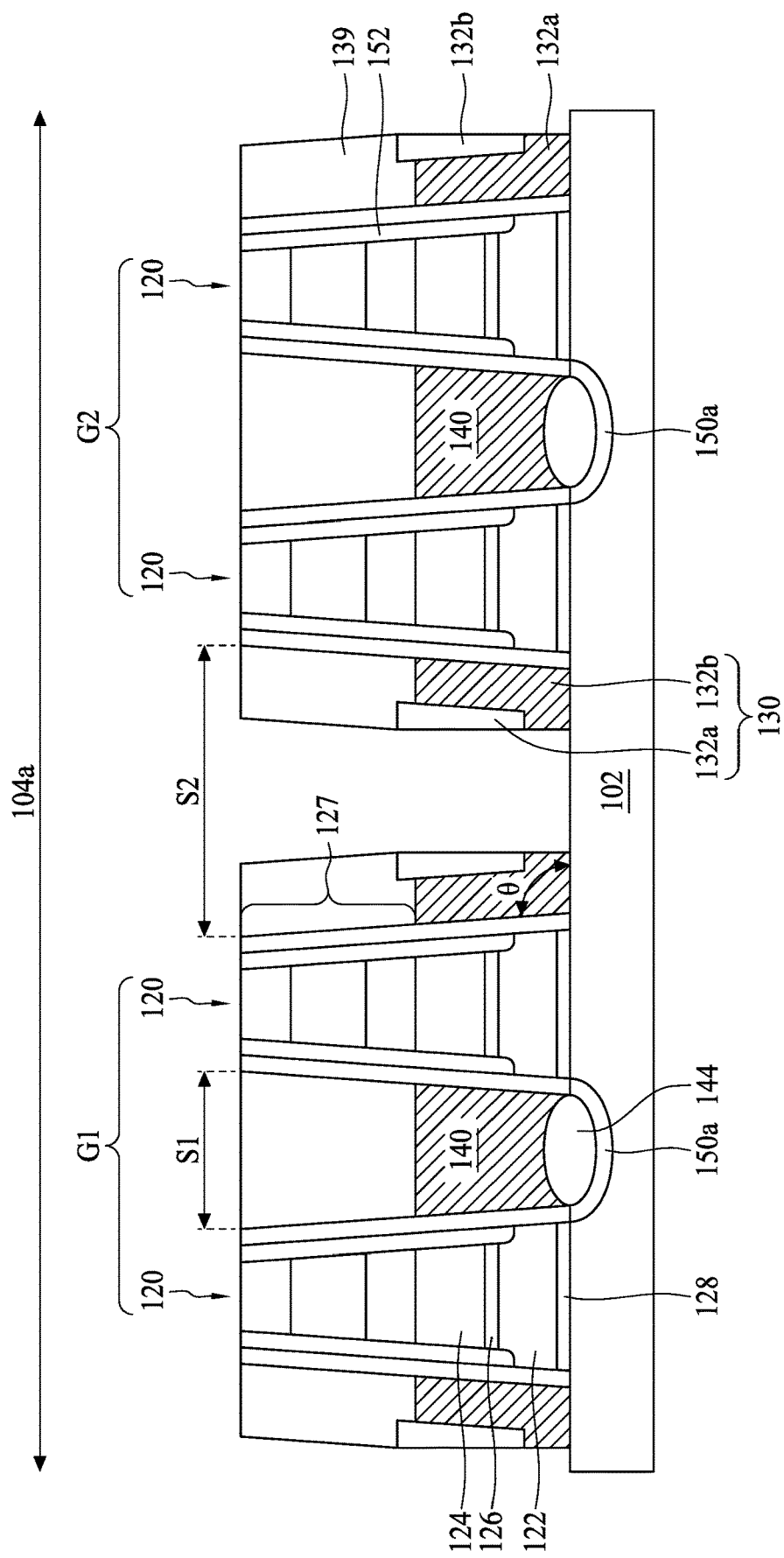

Referring to FIG. 8G, the portion of the second semiconductor layer 132b between the two groups G1 and G2 exposed through the hard mask spacer 139 and a portion of the first semiconductor layer 132a are removed through the hard mask spacer 139 to form a gate structure 130 and expose a portion of the substrate 102. In some embodiments, an etchant is used to remove the portion of the second semiconductor layer 132b and the portion of the first semiconductor layer 132a. In some embodiments, the etchant has similar etching rates on the first and second semiconductor layers 132a and 132b. It should be noted that because the seam or void 133b is removed during the etching back operation, the hard mask layer 138 are not left on the second semiconductor layer 132b after the forming of the hard mask spacer 139; thus, the first and second semiconductor layers 132a and 132b between the two groups G1 and G2 can be removed and the semiconductor material residue issue can be mitigated. Additionally, the first semiconductor layer 132a between the two gate structures 120 in one group G1, G2 is protected by the hard mask spacer 139 during the forming of the gate structure 130.

In some comparative embodiments, when the abovementioned recess is formed after the etching back operation, the recess may be filled with the hard mask layer. The hard mask layer may not be removed during the forming of the hard mask spacer 139, and the hard mask residue may obstruct the removal of the semiconductor layers during the forming of the gate structure 130. Consequently, the semiconductor residue issue arises.

Still referring to FIG. 8G, the first semiconductor layer 132a is electrically isolated from the first doped region 150a by the isolation 144 and the first semiconductor layer 132a can be referred to as a gate structure 140. In some embodiments, the gate structure 130 serves as a select gate (SG) and the gate structure 140 serves as an erase gate (EG). Further, a width of the select gate 130 can be defined by a width of the hard mask spacer 139. In some embodiments, the select gate 130 and the erase gate 140 can include different compositions. For example, the select gate 130 includes the first semiconductor layer 132a and the second semiconductor layer 132b while the erase gate 140 includes the first semiconductor layer 132a.

In some embodiments, after forming the select gate 130 and the erase gate 140, a sacrificial gate structure (not shown) including an interfacial dielectric (IL), a high-k gate dielectric layer and a semiconductor layer can be formed over the substrate 102 in the peripheral region 104b and spacers can be formed over the substrate 102 in the peripheral region 104b.

Figure 8H:
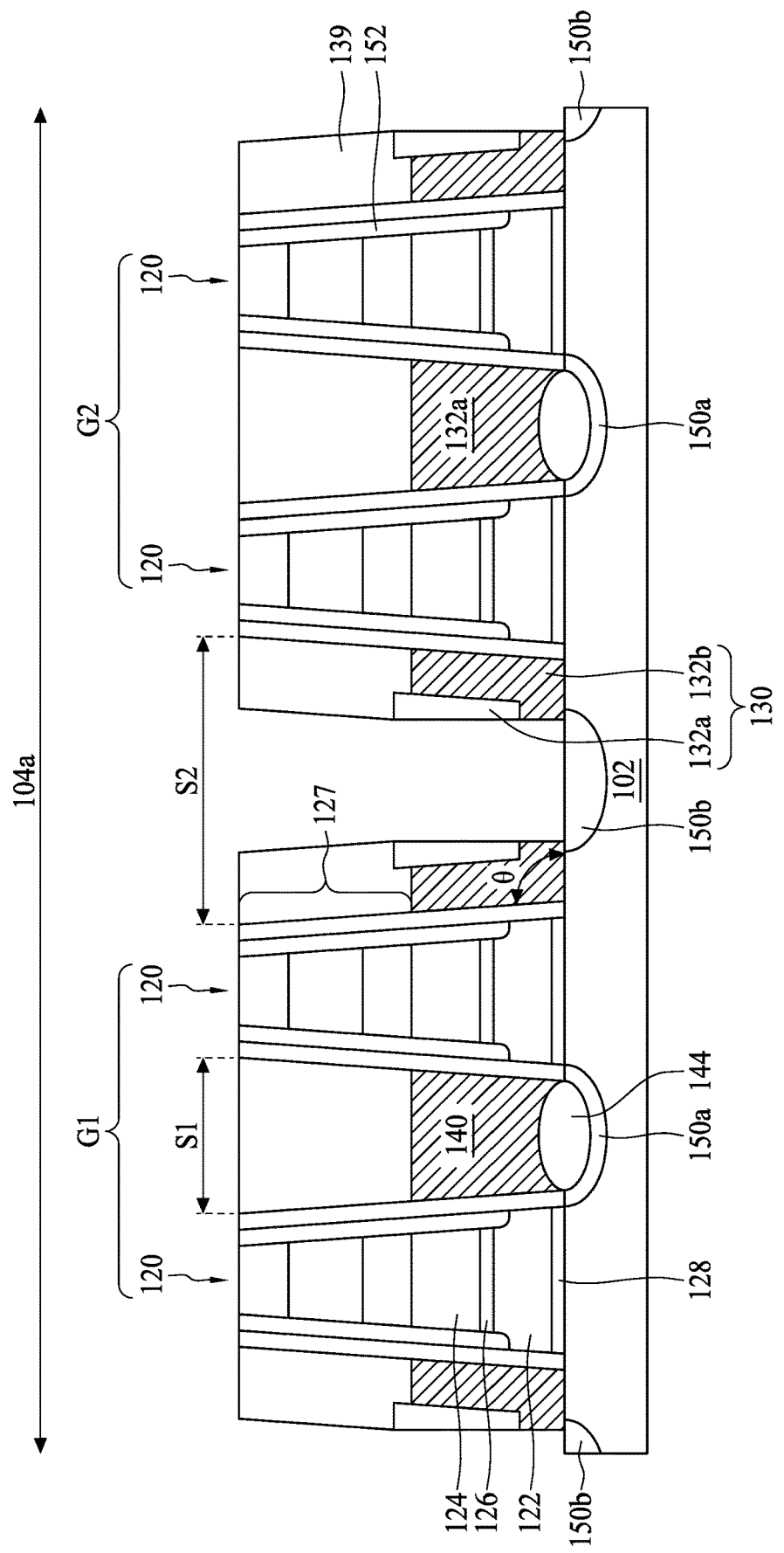

Referring to FIG. 8H, a plurality of second doped regions 150b are formed in portions of the substrate 102 exposed between the pair of the two gate structures 130. In some embodiments, the second doped region 150b serves as a drain region. Additionally, in some embodiments, the first and/or second doped regions 150a and 150b can be portion of an epitaxy layer such as a silicon epitaxy layer formed by epitaxy processing. As mentioned above, the first doped region 150a embedded between the two gate structures 120 serves as a common source region while the two second doped regions 150b embedded between the two gate structures 130 serve as bit lines. In other words, the pair of gate structures 120 and the common source region 150a are arranged between the two bit lines 150b. Further, channel regions are defined between the bit lines 150b and the common source region 150a. In some embodiments, the source/drain regions 118 (as shown in FIG. 1) for the logic devices can be simultaneously formed in the substrate 102 in the peripheral region 104b.

Figure 8I:
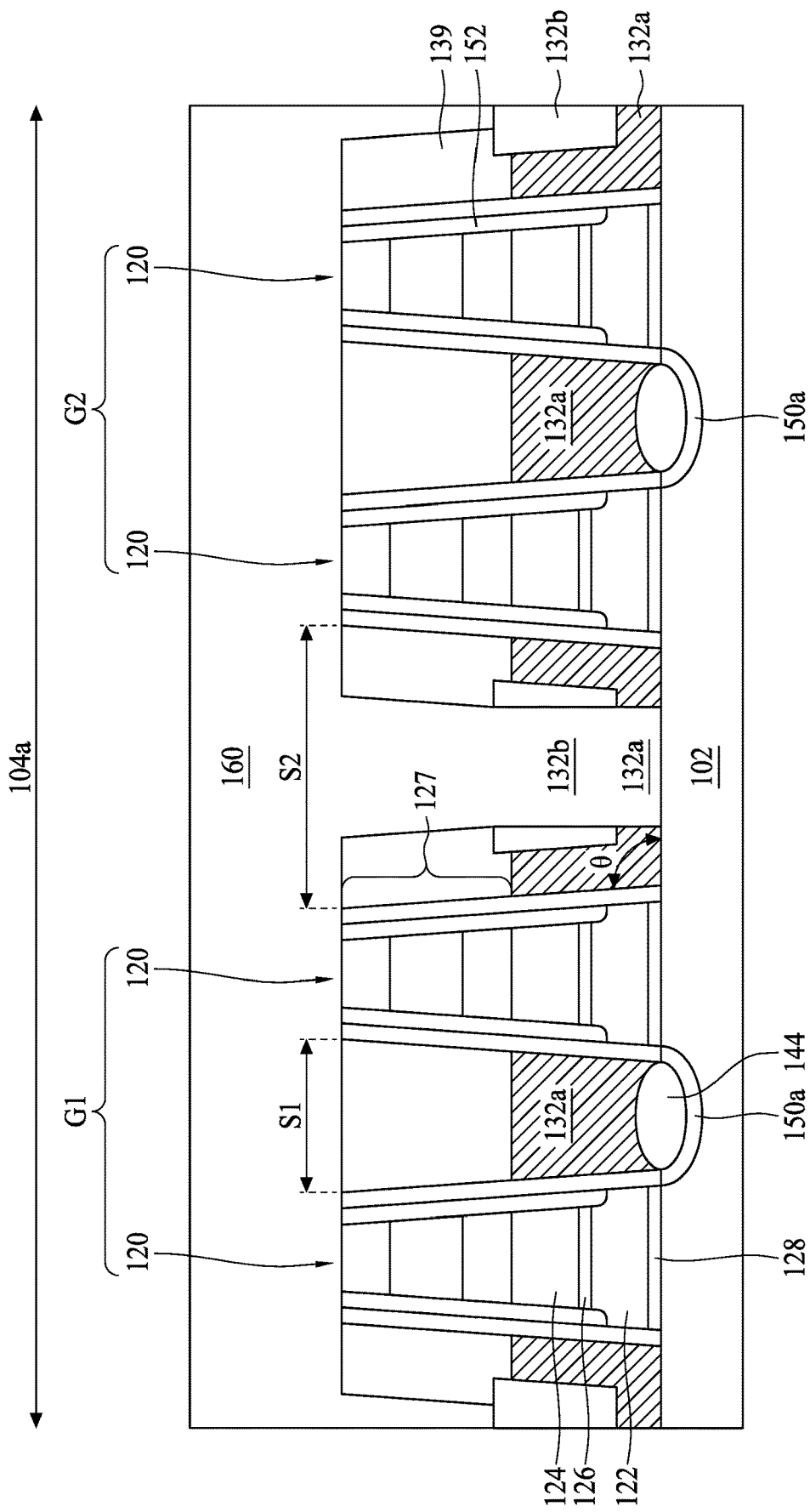

Referring to FIG. 8I, a dielectric structure 160 can be formed over the substrate 102. In some embodiments, the dielectric structure 160 can include a contact etch stop layer (CESL), though not shown. The dielectric structure 160 can further include an inter-layer dielectric (ILD) layer over the substrate 102. In some embodiments, the ILD layer is formed to embed all the devices over the substrate 102.

Figure 8J:
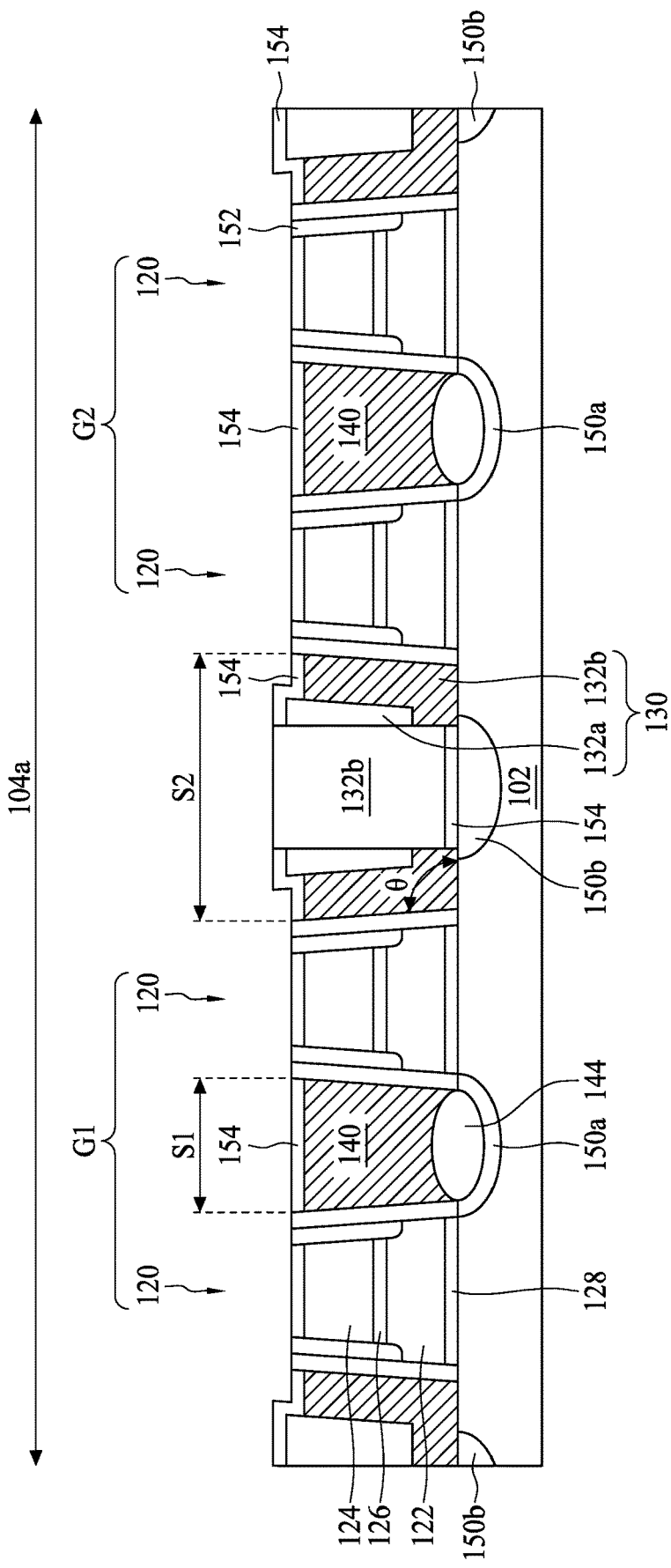

Referring to FIG. 8J, a planarization operation is performed to remove a superfluous portion of the ILD layer, a portions of the patterned mask structure 127, a portion of the hard mask spacers 139 and a portion of the spacers 152. Accordingly, top surfaces of the gate structures 130 and 140 are exposed. In some embodiments, metal salicide 154 can be formed on the top surfaces of the gate structures 130 and 140. In addition, metal salicide 154 can be formed on top surfaces of the second doped regions 150b. The metal salicide 154 is formed to reduce contact resistance. Therefore, even though the gate structure 130 has two different layers (i.e., the first and second semiconductor layers 132a and 132b), the contact resistance will not be an issue. Further, the metal salicide 154 on the top surface of the second doped region 150b can be a contact pad, but the disclosure is not limited thereto. Additionally, the metal salicide 154 can include nickel silicide, cobalt silicide or titanium silicide, but the disclosure is not limited thereto. In some embodiments, the top surface of the dummy gate structure may be exposed by the planarization. In some embodiments, a protecting layer (not shown) may be formed in the memory region 104a, and the dummy gate structure is removed to form a gate trench in the peripheral region 104b. Subsequently, a metal gate is formed to fill the gate trench. After the forming of the metal gate, a dielectric layer is formed over the substrate 102. In some embodiments, the dielectric layer is referred to as a part of the dielectric structure 160, as shown in FIG. 8I.

Figure 8K:
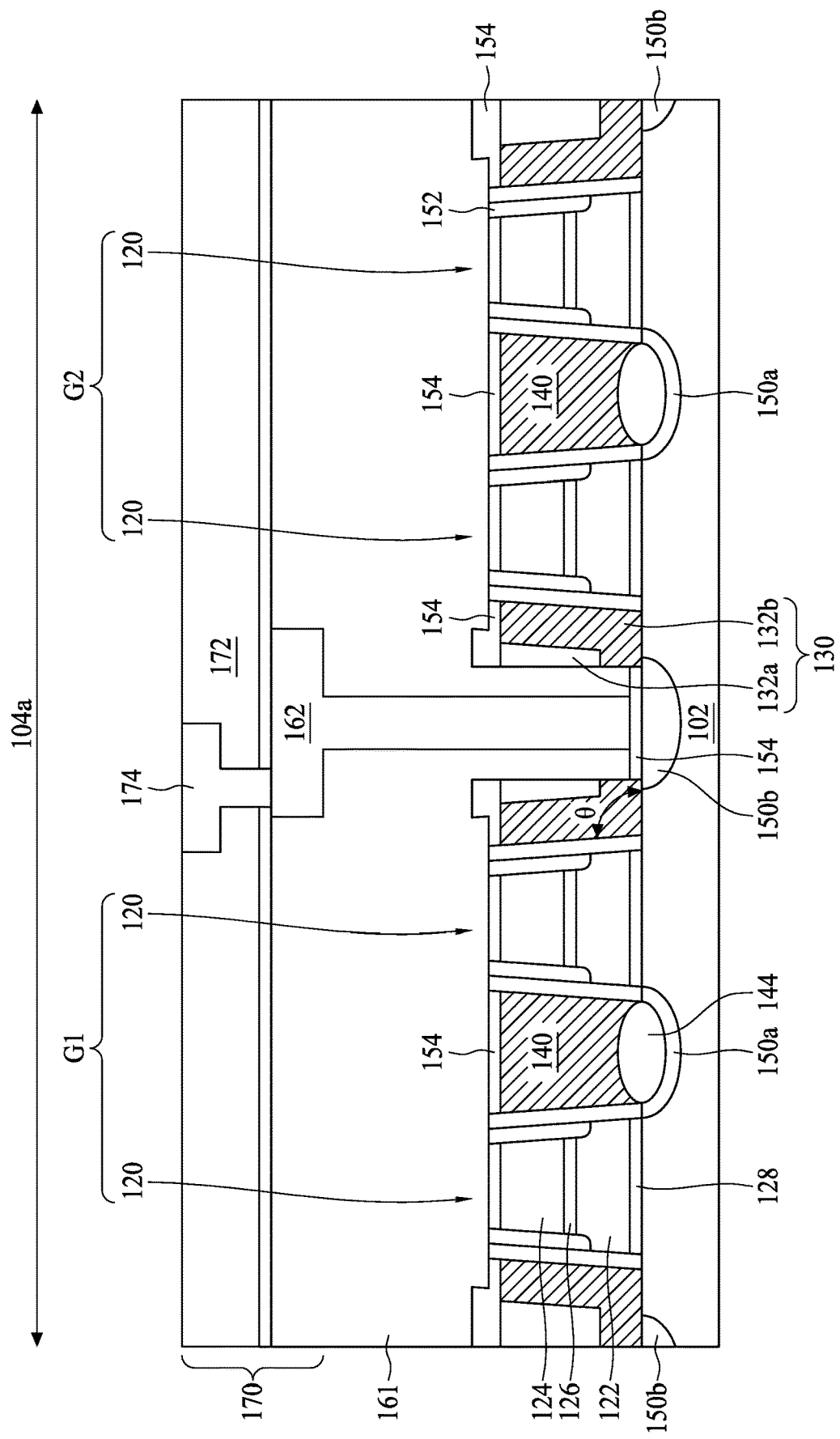

Referring to FIG. 8K, a dielectric structure 161 can be formed over the substrate 102, a connecting structure 162 can be formed in the dielectric structure 161. Thereafter, an interconnection structure 170 including dielectric layers 172 and conductive features 174, which include metal layers and vias, are formed over the dielectric structure 161. As shown in FIG. 8K, the conductive features 174 can be electrically connected to the connecting structure 162. Consequently, a semiconductor structure with memory device can be obtained as shown in FIG. 3.

According to the method provided by some embodiments of the present disclosure, the first and second semiconductor layers 132a and 132b having different etching rates are provided. Therefore, the seam or void 133b can be removed during the etching back operation. Accordingly, the hard mask residue issue and the semiconductor material residue issue can be mitigated, and the manufacturing operation yield can be improved.

Figure 9A:
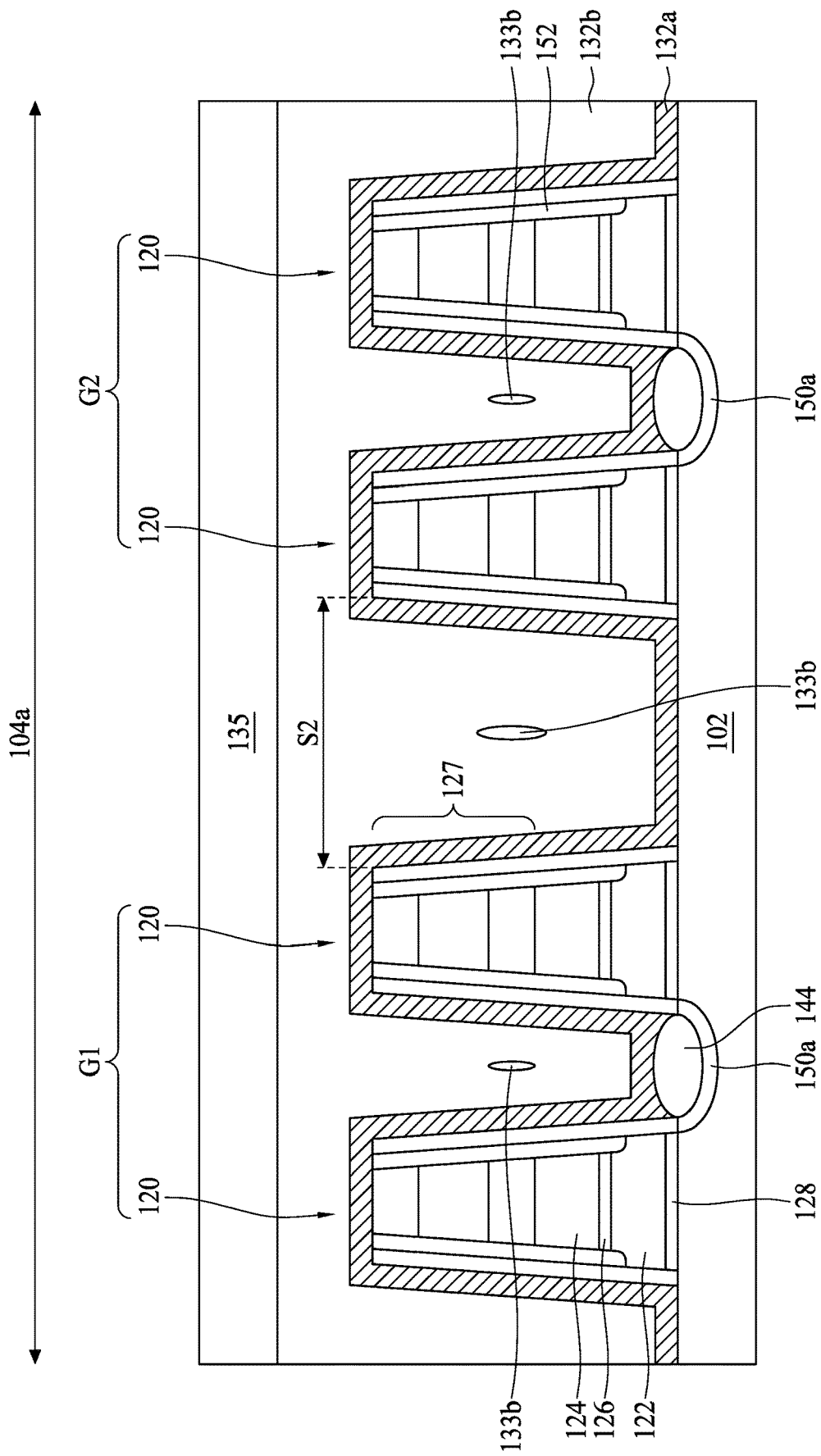
FIG. 9A to FIG. 9D illustrate cross-sectional views of a semiconductor structure for a memory device at different fabrication stages constructed according to aspects of the present disclosure in one or more embodiments.

Please refer to FIGS. 9A to 9D, which are cross-sectional views of a semiconductor structure for a memory device at different fabrication stages constructed according to aspects of the present disclosure in one or more embodiments. It should be noted that same elements in the FIGS. 8A to 8K and FIGS. 9A to 9D are depicted by the same numerals, and details of the same elements shown in FIGS. 8A to 8K and FIGS. 9A to 9D are omitted in the description for brevity. In some embodiments, vacant spaces between the gate structures 120 are not filled with the first semiconductor layer 132a. As shown in FIG. 9A, the first semiconductor layer 132a is conformally formed over the substrate 102 and the gate structures 120. Therefore, the first semiconductor layer 132a covers a top surface of the substrate 102, top surfaces of the gate structures 120, a top surface of the dielectric layer 144 and sidewalls of the gate structures 120.

After the forming of the first semiconductor layer 132a, a second semiconductor layer 132b is formed on the first semiconductor layer 132a. A thickness of the second semiconductor layer 132b is greater than the thickness of the first semiconductor layer 132a. In some embodiments, by adjusting the thicknesses of the first and second semiconductor layer 132a and 132b, vacant spaces between the gate structures 120 in each group G1, G2 and vacant spaces between the two groups G1 and G2 can be filled with the second semiconductor layer 132b. In some embodiments, a seam or a void 133b may be formed within the second semiconductor layer 132b, as shown in FIG. 9A. Further, a sacrificial layer 135 is formed over the second semiconductor layer 132b to achieve a planar top surface for subsequent etching processes. Consequently, a top surface of the formed sacrificial layer 135 is substantially flat.

Figure 9B:
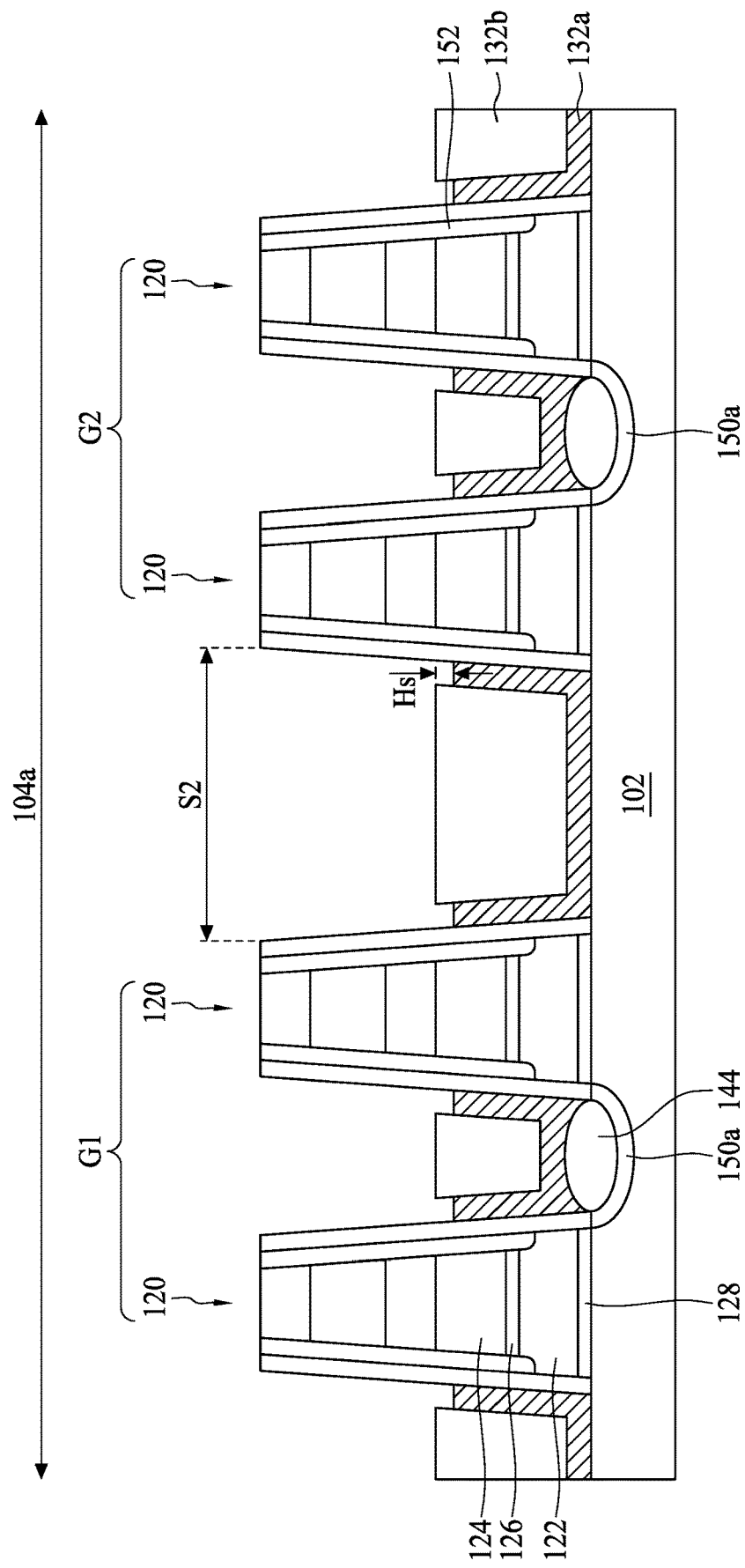

Referring to FIG. 9B, an etching back operation is performed to remove the sacrificial layer 135, a portion of the second semiconductor layer 132b and a portion of the first semiconductor layer 132a with an etchant, such that upper portions of the gate structures 120 are exposed. In some embodiments, due to the different dopant concentrations of the first and second semiconductor layers 132a and 132b, an etching rate of the first semiconductor layer 132a upon exposure to the etchant is greater than an etching rate of the second semiconductor layer 132b upon exposure to the etchant, and thus a greater portion of the first semiconductor layer 132a is removed. In some embodiments, a step height Hs is formed between a top surface of the second semiconductor layer 132b and a top surface of the first semiconductor layer 132a. The step height Hs is between approximately 0 angstroms and approximately 200 angstroms, but the disclosure is not limited thereto. In some embodiments, the void or seam 133b in the second semiconductor layer 132b may be removed by the etching back operation.

Figure 9C:
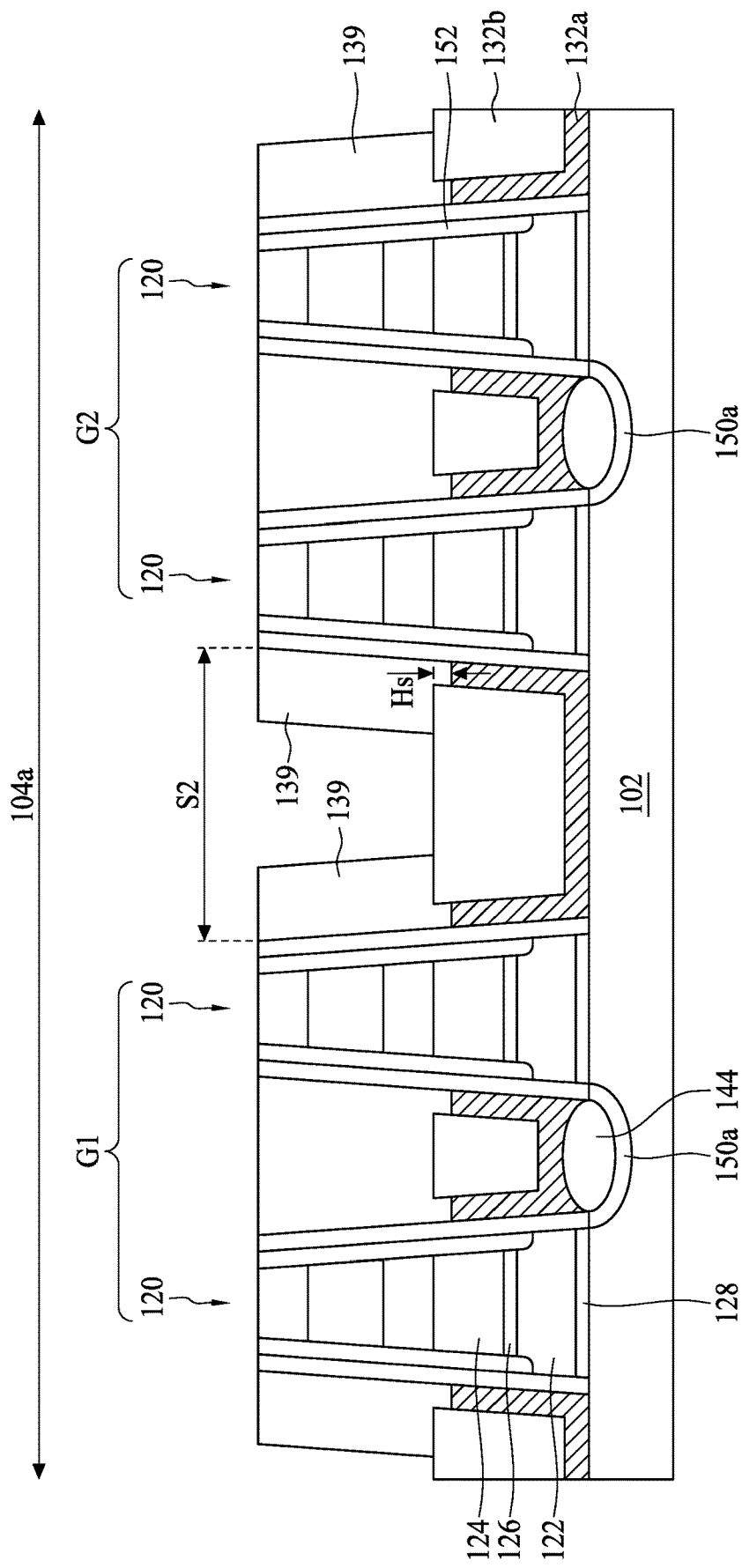

Referring to FIG. 9C, a hard mask layer (not shown) can be formed over the substrate 102. Subsequently, the hard mask layer is etched back to remove a lateral portion thereof and form hard mask spacers 139 over the sidewalls of the gate structures 120. Further, a portion of the second semiconductor layer 132b between the two groups G1 and G2 is exposed through the hard mask spacer 139. However, the portions of the first semiconductor layer 132a and the second semiconductor layer 132b that are between the two gate structures 120 in each group G1, G2 are covered by the hard mask spacer 139.

Figure 9D:
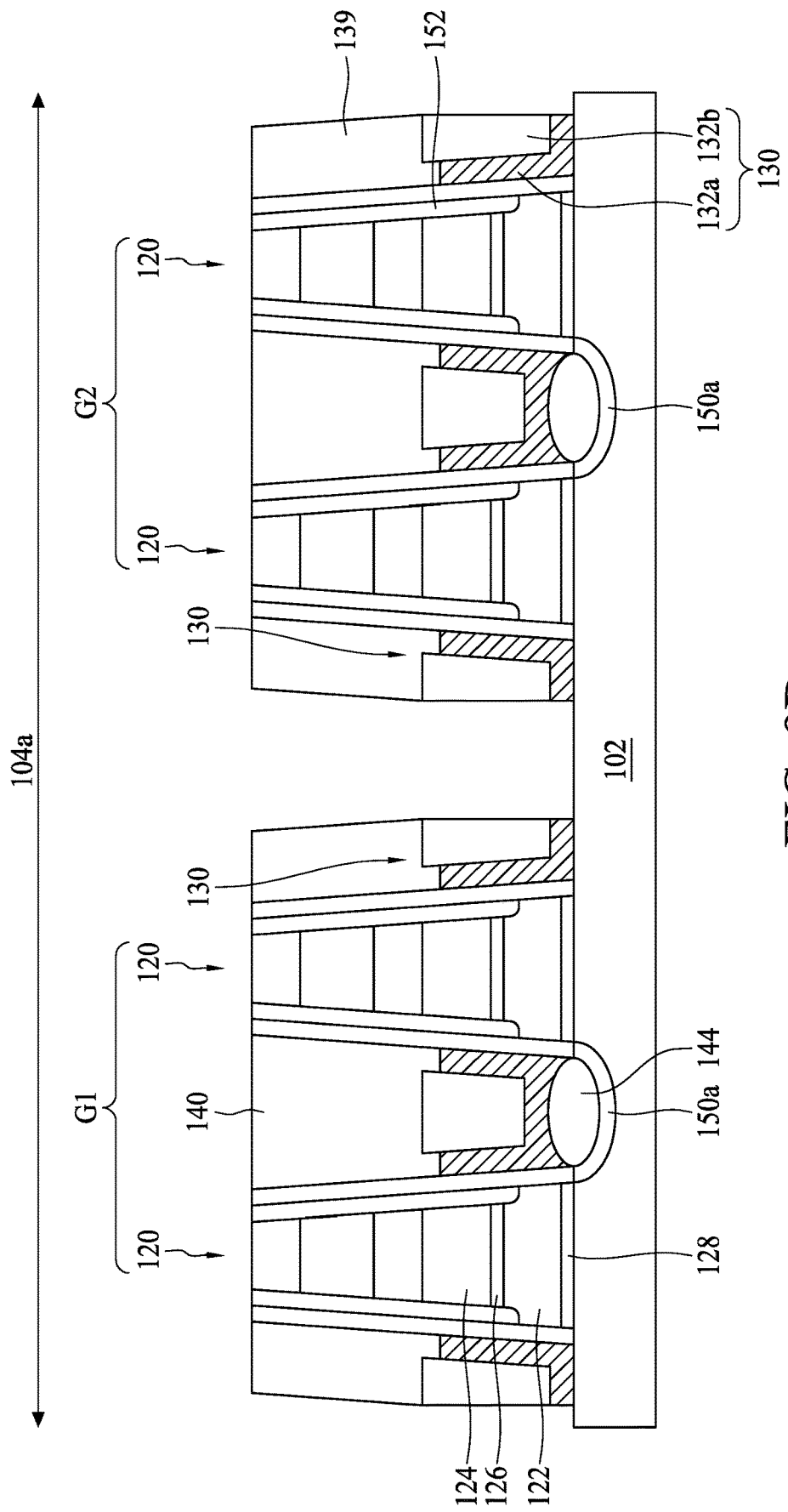

Referring to FIG. 9D, portions of the second semiconductor layer 132b and the first semiconductor layer 132a between the two groups G1 and G2 exposed through the hard mask spacer 139 are removed through the hard mask spacer 139 to form a gate structure 130 and expose a portion of the substrate 102. In some embodiments, an etchant is used to remove the portion of the second semiconductor layer 132b and the portion of the first semiconductor layer 132a. In some embodiments, the etchant has similar etching rates on the first and second semiconductor layers 132a and 132b. As mentioned above, because the seam or void 133b is removed during the etching back operation, the hard mask layer 138 is not left on the second semiconductor layer 132b after the forming of the hard mask spacer 139; thus, the first and second semiconductor layers 132a and 132b between the two groups G1 and G2 can be removed and the semiconductor material residue issue can be mitigated. However, the portion of the first semiconductor layer 132a and the second semiconductor layer 132b between the two gate structures 120 in each group G1, G2 are protected by the hard mask spacer 139 during the forming of the gate structure 130. The first semiconductor layer 132a, as shown in FIG. 9D, is electrically isolated from the first doped region 150a by the isolation 144 and the first semiconductor layer 132a can be referred to as a gate structure 140. In some embodiments, the gate structure 130 serves as a select gate and the gate structure 140 serves as an erase gate. In some embodiments, the select gate 130 and the erase gate 140 can include similar compositions. For example, both of the select gate 130 and the erase gate 140 include the first semiconductor layer 132a and the second semiconductor layer 132b. However, the first semiconductor layer 132a in the select gate 130 has an L shape while the first semiconductor layer 132a in the erase gate 140 has a U shape.

Further, operations as described above can be performed to form a semiconductor structure with a memory device shown in FIG. 1 or 2; therefore, such details are omitted in the description for brevity.

Figure 10A:
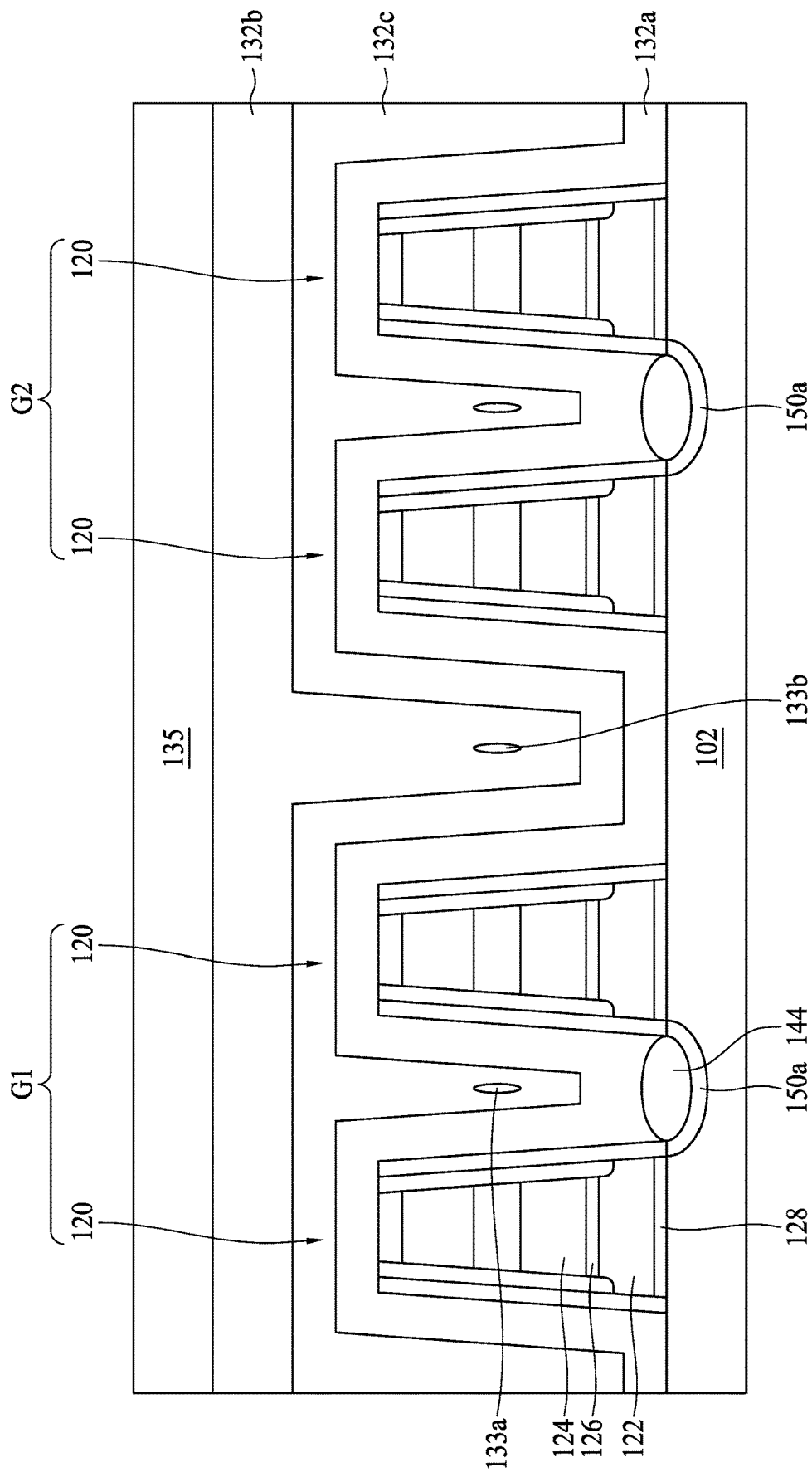
FIG. 10A to FIG. 10D illustrate cross-sectional views of a semiconductor structure for a memory device at different fabrication stages constructed according to aspects of the present disclosure in one or more embodiments.

Please refer to FIGS. 10A to 10D, which are cross-sectional views of a semiconductor structure for a memory device at different fabrication stages constructed according to aspects of the present disclosure in one or more embodiments. It should be noted that same elements in the FIGS. 8A to 8K and FIGS. 10A to 10D are depicted by the same numerals, and details of the same elements shown in FIGS. 8A to 8K and 10A to 10D are omitted in the description for brevity. As shown in FIG. 10A, the first semiconductor layer 132a is conformally formed over the substrate 102 and the gate structures 120. Therefore, the first semiconductor layer 132a covers a top surface of the substrate 102, top surfaces of the gate structures 120, a top surface of the dielectric layer and sidewalls of the gate structures 120. After the forming of the first semiconductor layer 132a, a second semiconductor layer 132b is formed on the first semiconductor layer 132a. In some embodiments, a third semiconductor layer 132c can be formed prior to the forming of the second semiconductor layer 132b, as shown in FIG. 10A. The third semiconductor layer 132c is formed between the first and second semiconductor layers 132a and 132b. In some embodiments, a thickness ratio between the first semiconductor layer 132a, the second semiconductor layer 132b and the third semiconductor layer 132c can be 1:1:1, but the disclosure is not limited thereto. For example, in other embodiments, the thickness of the second semiconductor layer 132b is greater than the thickness of the first semiconductor layer 132a and the thickness of the third semiconductor layer 132c. In some embodiments, spaces between the two groups G1 and G2 are filled with the second semiconductor layer 132b. In some embodiments, vacant spaces between two gate structures 120 in each group G1, G2 may be filled with the first semiconductor layer 132a, the second semiconductor layer 132b or the third semiconductor layer 132c, depending on a spacing distance S1 between the two gate structures 120 and the thicknesses of the first, second and third semiconductor layers 132a, 132b and 132c.

The three semiconductor layers 132a, 132b and 132c can include a same semiconductor material, such as silicon. In some embodiments, when the gate structure to be formed is an n-type gate structure, the first, second and third semiconductor layers 132a, 132b and 132c can include n-type dopants such as As, Sb or P. When the gate structure to be formed is a p-type gate structure, the first, second and third semiconductor layers 132a, 132b and 132c can include p-type dopants such as B. However, a dopant concentration of the third semiconductor layer 132c is between a dopant concentration of the first semiconductor layer 132a and a dopant concentration of the second semiconductor layer 132b. In some embodiments, when the three semiconductor layers 132a, 132b and 132c are used to form the n-type gate, the dopant concentration of, for example, P in the first semiconductor layer 132a is greater than approximately $1E19$ cm$^{-3}$, the dopant concentration of P in the second semiconductor layer 132b is less than approximately $5E18$ cm$^{-3}$, and the dopant concentration of P in the third semiconductor layer 132c is between approximately $1E19$ cm$^{-3}$ and approximately $5E18$ cm$^{-3}$, but the disclosure is not limited thereto. In some alternative embodiments, when the three semiconductor layers 132a, 132b and 132c are used to form a p-type gate, the dopant concentration of, for example, B of the first semiconductor layer 132a is less than approximately $5E18$ cm$^{-3}$, the dopant concentration of B in the second semiconductor layer 132b is greater than approximately $1E19$ cm$^{-3}$, and the dopant concentration of B in the third semiconductor layer 132c is between approximately $5E18$ cm$^{-3}$ and approximately $1E19$ cm$^3$, but the disclosure is not limited thereto. Significantly, due to the different dopant concentrations of the first, second and third semiconductor layers 132a, 132b and 132c, an etching rate of the third semiconductor layer 132c upon exposure to an etchant is made to be between an etching rate of the first semiconductor layer 132a and an etching rate of the second semiconductor layer 132b.

Further, a sacrificial layer 135 is formed over the second semiconductor layer 132b to achieve a planar top surface for subsequent etching processes. Consequently, a top surface of the formed sacrificial layer 135 is substantially flat.

Still referring to FIG. 10A, in some embodiments, a seam or void 133a may be formed in the first semiconductor layer 132a or in the third semiconductor layer 132c between the two gate structures 120 in the group G1 and/or G2. In some embodiments, a seam or void 133b may be formed in the second semiconductor layer 132b between the groups G1 and G2.

Figure 10B:
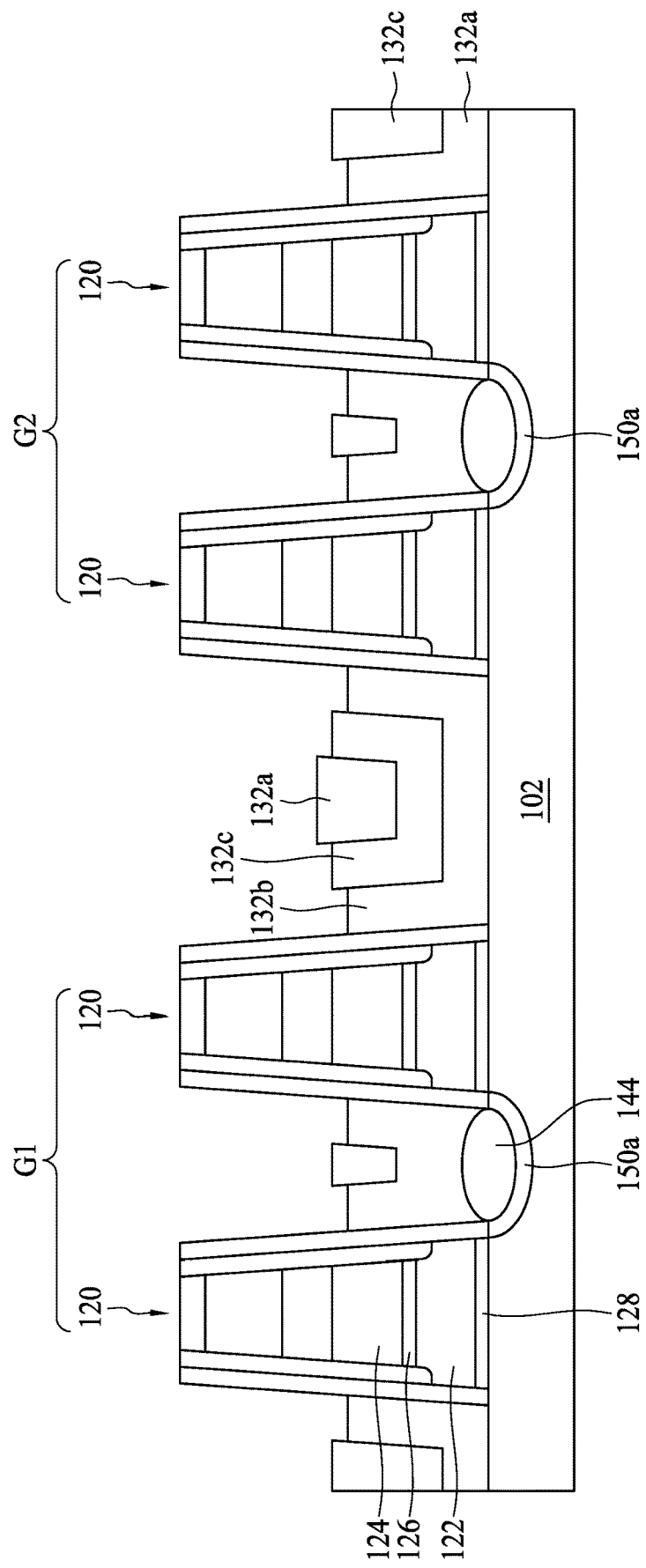

Referring to FIG. 10B, an etching back operation is performed to remove the sacrificial layer 135, a portion of the second semiconductor layer 132b, a portion of the third semiconductor layer 132c and a portion of the first semiconductor layer 132a with an etchant, such that upper portions of the gate structures 120 are exposed. In some embodiments, because the etching rate of the first semiconductor layer 132a is greater than the etching rate of the third semiconductor layer 132c, and the etching rate of the third semiconductor layer 132c is greater than the etching rate of the second semiconductor layer 132b, a step height may be formed between a top surface of the third semiconductor layer 132c and a top surface of the first semiconductor layer 132a, and another step height may be formed between the top surface of the third semiconductor layer 132c and a top surface of the second semiconductor layer 132b. In some embodiments, the semiconductor layers 132a, 132b and 132c between the two groups G1 and G2 may have a pyramid configuration, but the disclosure is not limited thereto. In some embodiments, the void or seam 133a in the first or third semiconductor layer 132a or 132c and the void or seam 133b in the second semiconductor layer 132b may be removed by the etching back operation.

Figure 10C:
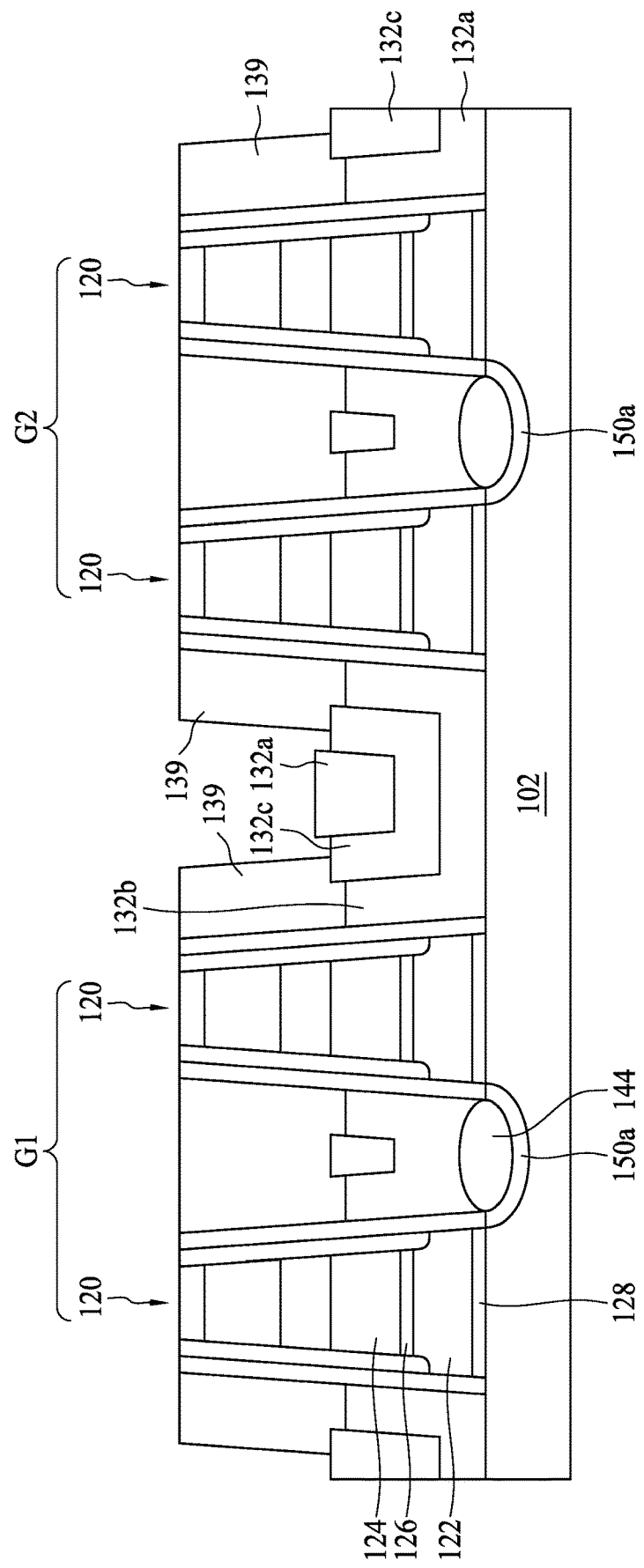

Referring to FIG. 10C, a hard mask layer (not shown) can be formed over the substrate 102. Subsequently, the hard mask layer is etched back to remove a lateral portion thereof and form hard mask spacers 139 over the sidewall of the gate structures 120. Further, a portion of the second semiconductor layer 132b between the two groups G1 and G2 is exposed through the hard mask spacer 139. In some embodiments, a portion of the third semiconductor layer 132c between the two groups G1 and G2 may also be exposed through the hard mask spacer 139. However, the portions of the three semiconductor layers 132a, 132c and 132b that are between the two gate structures 120 in each group G1, G2 are covered by the hard mask spacer 139.

Figure 10D:
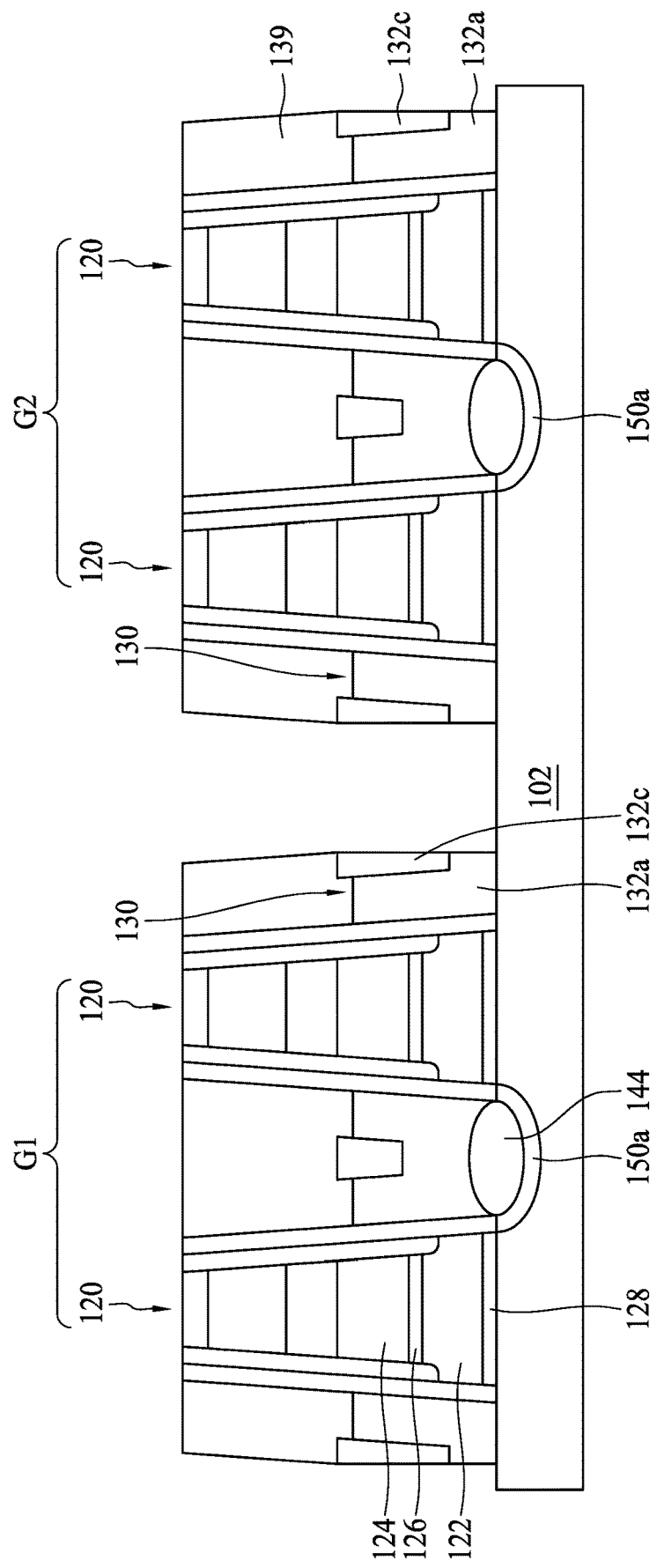

Referring to FIG. 10D, the portions of the second semiconductor layer 132b, the third semiconductor layer 132c and the first semiconductor layer 132a that are between the two groups G1 and G2 and exposed through the hard mask spacer 139 are removed through the hard mask spacer 139 to form a gate structure 130 and expose a portion of the substrate 102. In some embodiments, an etchant is used to remove the portion of the second semiconductor layer 132b, the portion of the third semiconductor layer 132c, and the portion of the first semiconductor layer 132a. In some embodiments, the etchant has similar etching rates on the first, second and third semiconductor layers 132a, 132b and 132c. As mentioned above, because the seam or void 133b is removed during the etching back operation, the hard mask layer 138 is not left on the second semiconductor layer 132b after the forming of the hard mask spacer 139; thus, the first and second semiconductor layers 132a and 132b between the two groups G1 and G2 can be removed and the semiconductor material residue issue can be mitigated. However, the semiconductor layers between the two gate structures 120 in each group G1, G2 are protected by the hard mask spacer 139 during the forming of the gate structure 130. The first semiconductor layer 132a, as shown in FIG. 10D, is electrically isolated from the first doped region 150a by the isolation 144 and the first semiconductor layer 132a can be referred to as a gate structure 140. In some embodiments, the gate structure 130 serves as a select gate and the gate structure 140 serves as an erase gate. In some embodiments, the select gate 130 and the erase gate 140 can include similar compositions. For example, both of the select gate 130 and the erase gate 140 include the first semiconductor layer 132a and the third semiconductor layer 132c. However, the first semiconductor layer 132a in the select gate 130 has an L shape while the first semiconductor layer 132a in the erase gate 140 has a U shape.

Figure 11:
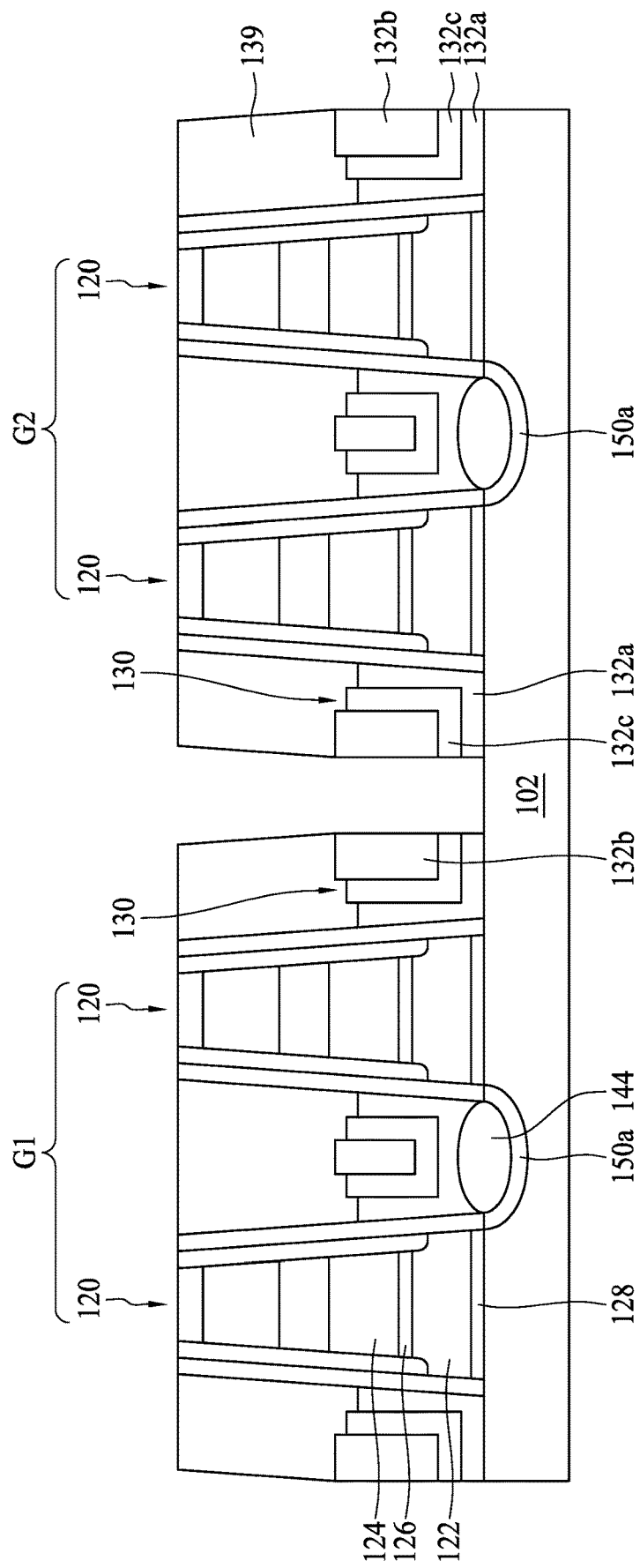
FIG. 11 illustrates a cross-sectional view of a semiconductor structure for a memory device at a fabrication stage constructed according to aspects of the present disclosure in one or more embodiments.

FIG. 11 is a cross-sectional view of a semiconductor structure for a memory device at a fabrication stag constructed according to aspects of the present disclosure in one or more embodiments. It should be noted that same elements in FIG. 10D and FIG. 11 are depicted by the same numerals, and that details of the same elements are omitted in the description for brevity. As mentioned above, a width of the gate structures 130 can be adjusted by a thickness of the hard mask spacer 139. Further, the composition of the gate structures can be adjusted by a thickness of the first, second and third semiconductor layers 132a, 132b and 132c. In some embodiments, by adjusting the thickness of the semiconductor layers 132a, 132b and 132c and adjusting the thickness of the hard mask spacer 139, the second semiconductor layer 132b may be left in place over the substrate 102. In some embodiments, the gate structure 130 and the gate structure 140 can include similar compositions. In such embodiments, both of the gate structure 130 and the gate structure 140 may include the first semiconductor layer 132a, the third semiconductor layer 132c and the second semiconductor layer 132b, as shown in FIG. 11. However, while the first and third semiconductor layers 132a and 132c in the gate structure 130 have an L shape, the first and third semiconductor layers 132a and 132c in the gate structure 140 have a U shape. In other embodiments, the gate structure 130 and the gate structure 140 can include different compositions. For example, the gate structure 140 may include the first semiconductor layer 132a and the third semiconductor layer 132c while the select gate 130 may include the first, third and second semiconductor layers 132a, 132c and 132b.

Additionally, both of the first semiconductor layer 132a and the third semiconductor layer 132c in the select gate 130 have an L shape while the first semiconductor layer 132a and the third semiconductor layer 132c in the erase gate 140 has a U shape.

Further, operations as described above can be performed to form a semiconductor structure with a memory device as shown in FIG. 4; therefore, such details are omitted in the description for brevity.

Figure 12A:
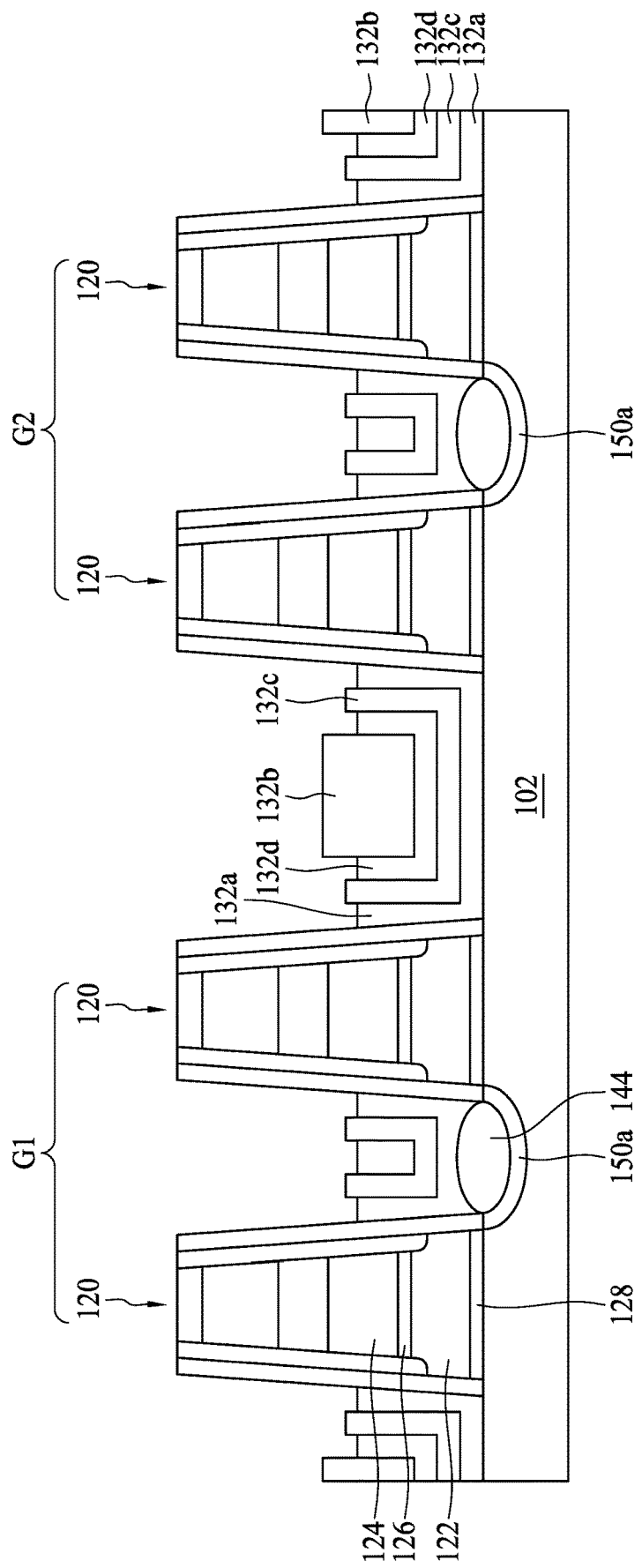
FIG. 12A and FIG. 12B illustrate cross-sectional views of a semiconductor structure for a memory device at different fabrication stages constructed according to aspects of the present disclosure in one or more embodiments.
Figure 12B:
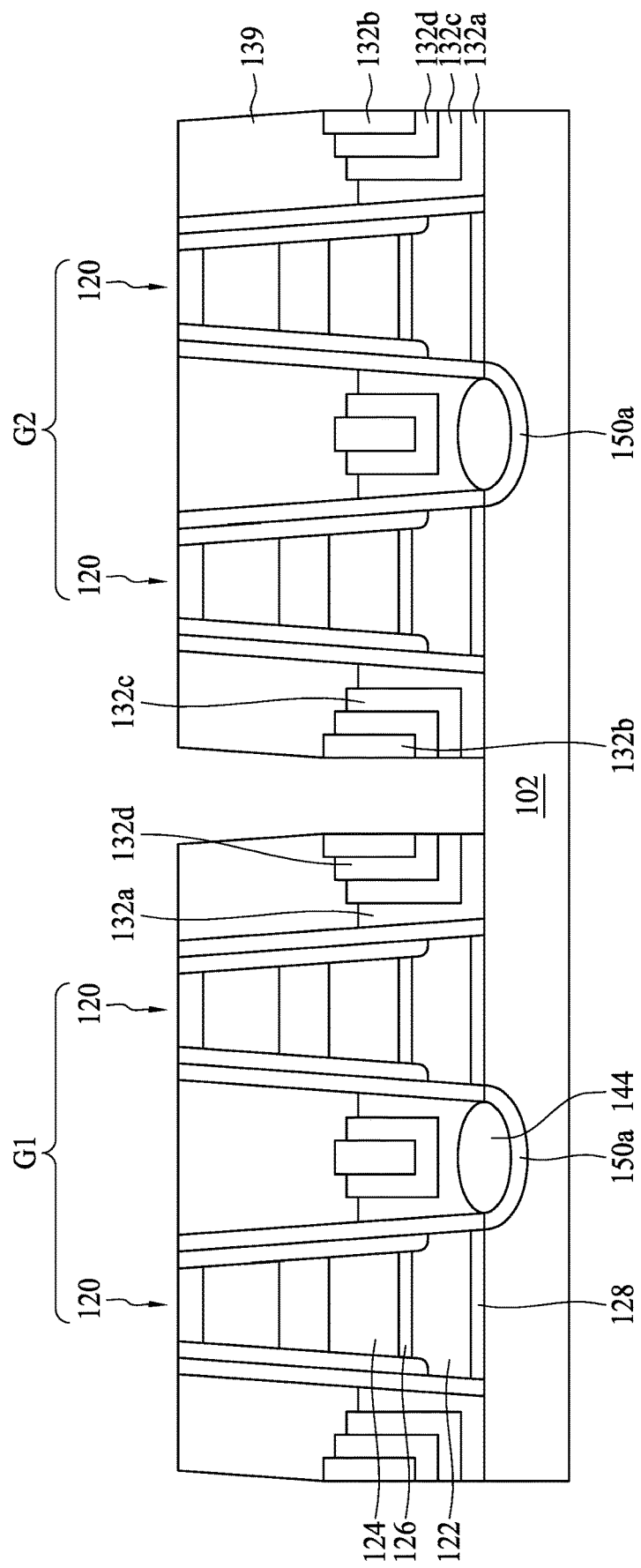

Please refer to FIGS. 12A and 12B, which are cross-sectional views of a semiconductor structure for a memory device at different fabrication stages constructed according to aspects of the present disclosure in one or more embodiments. It should be noted that same elements in the FIGS. 8A to 8K and FIGS. 12A to 12B are depicted by the same numerals, and that details of same elements shown in FIGS. 8A to 8K and 12A to 12B are omitted in the description for brevity. In some embodiments, four semiconductor layers 132a, 132b, 132c and 132d are formed between the gate structures 120. As shown in FIG. 12A, the first semiconductor layer 132a is conformally formed over the substrate 102 and the gate structures 120. Therefore the first semiconductor layer 132a covers a top surface of the substrate 102, top surfaces of the gate structures 120, a top surface of the dielectric layer 144 and sidewalls of the gate structures 120. After the forming of the first semiconductor layer 132a, a second semiconductor layer 132b is formed on the first semiconductor layer 132a. In some embodiments, a third semiconductor layer 132c and a fourth semiconductor layer 132d can be formed prior to the forming of the second semiconductor layer 132b, as shown in FIG. 12A. That is, the third semiconductor layer 132c and the fourth semiconductor layer 132d are formed between the first and second semiconductor layers 132a and 132b. In some embodiments, the fourth semiconductor layer 132d can be formed between the first and the third semiconductor layers 132a and 132c. In some alternative embodiments, the fourth semiconductor layer 132d can be formed between the third and the second semiconductor layers 132c and 132b, as shown in FIG. 12A.

In some embodiments, a thickness ratio between the first semiconductor layer 132a, the second semiconductor layer 132b, the third semiconductor layer 132c and the fourth semiconductor layer 132d can be 1:1:1:1, but the disclosure is not limited thereto. In some embodiments, the thickness of the second semiconductor layer 132b is greater than the thickness of the first semiconductor layer 132a, the thickness of the third semiconductor layer 132c and the thickness of the fourth semiconductor layer 132d. In some embodiments, spaces between two gate structures 120 in each group G1 and G2 may be filled with the first semiconductor layer 132a, the second semiconductor layer 132b, the third semiconductor layer 132c or the fourth semiconductor layer 132d, depending on spacing distance S1 between the two gate structures 120 in each group G1 and G2, and the thicknesses of the first, second, third and fourth semiconductor layers 132a, 132b, 132c and 132d.

The four semiconductor layers 132a, 132b, 132c and 132d can include a same semiconductor material, such as silicon. In some embodiments, when the gate structure to be formed is an n-type gate structure, the four semiconductor layers 132a, 132b, 132c and 132d can include n-type dopants such as As, Sb or P. When the gate structure to be formed is a p-type gate structure, the four semiconductor layers 132a, 132b, 132c and 132d can include p-type dopants such as B. However, dopant concentrations of the first, second, third and fourth semiconductor layers 132a, 132b, 132c and 132d are different from each other. The difference in dopant concentrations causes a difference in etching rate of the four layers. Therefore, the etching rates of the four layers are different from each other.

Further, a sacrificial layer (not shown) is formed over the second semiconductor layer 132b to achieve a planar top surface for subsequent etching processes. Consequently, a top surface of the formed sacrificial layer is substantially flat.

In some embodiments, a seam or void (not shown) may be formed in the first semiconductor layer 132a, the third semiconductor layer 132c or the fourth semiconductor layer 132d between the two gate structures 120 in the group G1 or G2. In some embodiments, a seam or void (not shown) may be formed in the second semiconductor layer 132b between the two groups G1 and G2.

Still referring to FIG. 12A, an etching back operation is performed to remove the sacrificial layer, a portion of the second semiconductor layer 132b, a portion of the fourth semiconductor layer 132d, a portion of the third semiconductor layer 132c and a portion of the first semiconductor layer 132a with an etchant, such that upper portions of the gate structures 120 are exposed. In some embodiments, because the etching rates of the first semiconductor layer 132a, the third semiconductor layer 132c, the fourth semiconductor layer 132d and the second semiconductor layer 132b are different from each other, step heights may be formed as shown in FIG. 12A. Significantly, the seam or void formed in the semiconductor layer may be removed by the etching back operation.

Referring to FIG. 12B, a hard mask layer (not shown) can be formed over the substrate 102. Subsequently, the hard mask layer is etched back to remove a lateral portion thereof and form hard mask spacers 139 over the sidewalls of the gate structures 120. Further, a portion of the second semiconductor layer 132b between the two groups G1 and G2 is exposed through the hard mask spacer 139. Subsequently, the portions of the second semiconductor layer 132b, the fourth semiconductor layer 132d, the third semiconductor layer 132c and the first semiconductor layer 132a that are between two groups G1 and G2 exposed through the hard mask spacer 139 are removed through the hard mask spacer 139 to form a gate structure 130 and expose a portion of the substrate 102. In some embodiments, an etchant is used to remove the portions of the semiconductor layers 132a, 132b, 132c and 132d. In some embodiments, the etchant has similar etching rates on the first, second, third and fourth semiconductor layers 132a, 132b, 132c and 132d. As mentioned above, because the seam or void is removed during the etching back operation, the hard mask layer is not left on the second semiconductor layer 132b after the forming of the hard mask spacer 139; thus, the portions of the four semiconductor layers 132a, 132b, 132c and 132d between the two groups G1 and G2 can be removed and the semiconductor material residue issue can be mitigated. However, the semiconductor layers between the two gate structures 120 in each group are still protected by the hard mask spacer 139 during the forming of the gate structure 130.

The first semiconductor layer 132a, as shown in FIG. 12B, is electrically isolated from the first doped region 150a by the isolation 144 and the first semiconductor layer 132a can be referred to as a gate structure 140. In some embodiments, the gate structure 130 serves as a select gate and the gate structure 140 serves as an erase gate. In some embodiments, the select gate 130 and the erase gate 140 can include different compositions. For example, the erase gate 140 can include the first, third and fourth semiconductor layers 132a, 132c and 132d while the select gate 130 can include the first, second, third and fourth semiconductor layers 132a, 132b, 132c and 132d. However, in some embodiments, the erase gate 140 and the select gate 130 can include similar configurations. In such embodiments, both of the select gate 130 and the erase gate 140 can include the first, second, third and fourth semiconductor layers 132a, 132b, 132c and 132d, but the first, third and fourth semiconductor layers 132a, 132c and 132d in the select gate 130 may have shapes different from that of the erase gate 140, though not shown.

Further, operations as described above can be performed to form a semiconductor structure with a memory device as shown in FIG. 5; therefore, such details are omitted in the description for brevity.

In some embodiments, operations can be performed to form a SONOS split-gate flash memory as shown in FIG. 6.

It will be appreciated that in the forgoing method, semiconductor layers having different dopant concentrations are formed to fill the gap between the gate structures, and thus different etching rates are provided. Due to the difference in etching rates, a profile of the thinned polysilicon layer is modified during the etching back operation. In some embodiments, even if a seam or void is formed during the forming of the polysilicon layer, the recess issue can be mitigated after the etching back operation. Consequently, the silicon residue defect is reduced and thus yield is improved.

According to one embodiment of the present disclosure, a semiconductor structure for a memory device is provided. The semiconductor structure includes a first gate structure and a second gate structure adjacent to the first gate structure. The second gate structure includes a first layer and a second layer, and the first layer is between the second layer and the first gate structure. In some embodiments, the first layer and the second layer include a same semiconductor material and same dopants. In some embodiments, the first layer has a first dopant concentration, and the second layer has a second dopant concentration different from the first dopant concentration.

According to another embodiment, a memory device is provided. The memory device includes a substrate, a first gate structure over the substrate, a first doped region in the substrate, and a second gate structure over the substrate and adjacent to the first gate structure. In some embodiments, the first gate structure is disposed between the second gate structure and the first doped region, and the second gate structure is over the substrate and adjacent to the first gate structure. In some embodiments, the second gate structure includes a first layer having a first dopant concentration and a second layer having a second dopant concentration different from the first dopant concentration.

According to one embodiment of the present disclosure, a method for forming a semiconductor structure is provided. The method includes following operations. A substrate including a first gate structure formed thereon is provided. A first semiconductor layer having a first dopant concentration is formed over the substrate and the first gate structure. A second semiconductor layer having a second dopant concentration is formed on the first semiconductor layer. An etching back operation is performed to remove a portion of the second semiconductor layer and a portion of the first semiconductor layer with an etchant. In some embodiments, the etching rate of the first semiconductor layer upon exposure to the etchant is greater than an etching rate of the second semiconductor layer upon exposure to the etchant. A hard mask spacer is formed over the first semiconductor layer and the second semiconductor layer. In some embodiments, a portion of the second semiconductor layer is exposed through the hard mask spacer. The portions of the second semiconductor layer and the first semiconductor layer are removed through the hard mask spacer to form a second gate structure and expose a portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for a memory device comprising:
   a first gate structure comprising a select gate; and
   a second gate structure comprising a control gate and adjacent to the first gate structure,
   wherein the second gate structure comprises a first layer and a second layer, the second layer is disposed over the first layer, wherein the second layer is embedded in the first layer, the first layer and the second layer comprise a same semiconductor material and same dopants, the first layer has a first dopant concentration, and the second layer has a second dopant concentration different from the first dopant concentration,
   wherein the second gate structure comprises an n-type gate structure, and the second dopant concentration of the second layer is less than the first dopant concentration of the first layer.

2. The semiconductor structure of claim 1, wherein the second gate structure further comprises a third layer between the first layer and the second layer, and the third layer has a third dopant concentration between the first dopant concentration of the first layer and the second dopant concentration of the second layer.

3. The semiconductor structure of claim 2, wherein the second gate structure further comprises a fourth layer between the first layer and the second layer, and the fourth layer is adjacent to the third layer and has a fourth dopant concentration greater than the third dopant concentration of the third layer.

4. The semiconductor structure of claim 1, wherein a thickness of the second layer is greater than a thickness of the first layer.

5. The semiconductor structure of claim 1, further comprising a third gate structure, wherein the first gate structure is disposed between the second gate structure and the third gate structure.

6. The semiconductor structure of claim 5, wherein the third gate electrode comprises a third layer and a fourth layer over the third layer, the first layer and the second layer of the second gate structure and the third layer and the fourth layer of the third gate structure comprise a same semiconductor material and same dopants, the third layer have the first dopant concentration, and the fourth layer have the second dopant concentration.

7. The semiconductor structure of claim 1, further comprising a metal salicide disposed over the second gate structure.

8. A memory device comprising:
   a substrate;
   a first gate structure over the substrate, wherein the first gate structure comprises a select gate;
   a first doped region in the substrate;
   an erase gate over the first doped region; and
   a second gate structure over the substrate and adjacent to the first gate structure, wherein the second gate structure comprises a control gate, the first gate structure is disposed between the second gate structure and the first doped region, wherein the second gate structure comprises a first layer having a first dopant concentration and a second layer having a second dopant concentration different from the first dopant concentration,
   wherein the second gate structure comprises a p-type gate structure, and the second dopant concentration of the second layer is greater than the first dopant concentration of the first layer.

9. The memory device of claim 8, wherein the first gate structure comprises a floating gate and a dielectric structure, the floating gate is disposed over the substrate, the control gate is disposed over the floating gate, and the dielectric structure is disposed between the floating gate and the control gate.

10. The memory device of claim 8, wherein the second gate structure further comprises a third layer between the first layer and the second layer, and the third layer has a third dopant concentration between the first dopant concentration of the first layer and the second dopant concentration of the second dopant layer.

11. The memory device of claim 8, wherein the erase gate comprises a third layer and a fourth layer over the third layer, the first layer and the second layer of the second gate structure and the third layer and the fourth layer of the erase gate structure comprise a same semiconductor material and same dopants.

12. The memory device of claim 11, wherein the third layer have the first dopant concentration, and the fourth layer have the second dopant concentration.

13. The semiconductor structure of claim 8, further comprising a metal salicide disposed over the second gate structure.

14. A semiconductor structure for a memory device comprising:
   a substrate;
   a first gate structure over the substrate;
   a second gate structure over the substrate, wherein the second gate structure comprises a first layer and a second layer over the first layer; and
   a third gate structure over the substrate, wherein the third gate structure comprises a third layer and a fourth layer over the third layer,
   wherein the first gate structure is disposed between the second gate structure and the third gate structure,
   wherein the first layer, second layer, the third layer and the fourth layer comprise a same semiconductor material and same dopants, the first layer and the third layer have a first dopant concentration, and the second layer and the fourth layer have a second dopant concentration different from the first dopant concentration, wherein the first layer of the second gate structure has an L shape, and the third layer of the third gate structure has a U shape.

15. The semiconductor structure of claim 14, wherein the second gate structure and the third gate structure comprise an n-type gate structure, and the second dopant concentration of the first layer and the third layer.

16. The semiconductor structure of claim 14, wherein the second gate structure and the third gate structure comprise a p-type gate structure, and the second dopant concentration of the second layer and the fourth layer is greater than the first dopant concentration of the first layer and the third layer.

17. The semiconductor structure of claim 14, wherein the first gate structure comprises:
 a floating gate over the substrate;
 a control gate over the floating gate; and
 a dielectric structure between the floating gate and the control gate.

18. The semiconductor structure of claim 14, further comprising:
 a first doped region in the substrate; and
 a second doped region in the substrate,
 wherein the third gate structure is disposed over the first doped region, the first gate structure is disposed between the second gate structure and the first doped region, and the second gate structure is disposed between the second doped region and the first gate structure.

19. The semiconductor structure of claim 18, further comprising an isolation disposed on the first doped region, wherein the third gate structure is electrically isolated from the first doped region by the isolation.

20. The semiconductor structure of claim 14, further comprising a metal salicide disposed over the second gate structure.

* * * * *